US012136669B2

(12) United States Patent
Li

(10) Patent No.: US 12,136,669 B2
(45) Date of Patent: Nov. 5, 2024

(54) HIGH HOLE MOBILITY TRANSISTOR (HHMT) AND METHOD OF MANUFACTURING THE SAME

(71) Applicant: GUANGDONG ZHINENG TECHNOLOGIES, CO. LTD., Guangdong (CN)

(72) Inventor: Zilan Li, Guangdong (CN)

(73) Assignee: GUANGDONG ZHINENG TECHNOLOGIES, CO. LTD., Guangdong (CN)

( * ) Notice: Subject to any disclaimer, the term of this patent is extended or adjusted under 35 U.S.C. 154(b) by 475 days.

(21) Appl. No.: 17/603,297

(22) PCT Filed: Sep. 30, 2019

(86) PCT No.: PCT/CN2019/109382
§ 371 (c)(1),
(2) Date: Oct. 12, 2021

(87) PCT Pub. No.: WO2020/206959
PCT Pub. Date: Oct. 15, 2020

(65) Prior Publication Data
US 2022/0199818 A1 Jun. 23, 2022

(30) Foreign Application Priority Data
Apr. 12, 2019 (CN) .......................... 201910291624.6

(51) Int. Cl.
H01L 29/778 (2006.01)
H01L 29/04 (2006.01)
(Continued)

(52) U.S. Cl.
CPC ........ H01L 29/7786 (2013.01); H01L 29/045 (2013.01); H01L 29/0657 (2013.01);
(Continued)

(58) Field of Classification Search
CPC ........... H01L 29/7786; H01L 29/66431; H01L 29/66462; H01L 29/7788; H01L 29/1029;
(Continued)

(56) References Cited

U.S. PATENT DOCUMENTS 10,332,691 B2    6/2019  Jia et al.
2014/0091366 A1* 4/2014  Jeon .................... H01L 21/8252
                                                     257/195
(Continued)

FOREIGN PATENT DOCUMENTS

CN    106410045 A    2/2017
CN    109524460 A    3/2019

Primary Examiner — Wasiul Haider
(74) Attorney, Agent, or Firm — Seed IP Law Group LLP

(57) ABSTRACT

The present disclosure relates to a semiconductor device and a method of fabricating the same. The semiconductor device includes: a substrate including a vertical interface; a channel layer disposed outside the vertical interface; and a channel supply layer disposed outside the channel layer; wherein a vertical two-dimensional electron gas 2DEG or two-dimensional hole gas 2DHG is formed in the channel layer adjacent to an interface between the channel layer and the channel supply layer.

31 Claims, 18 Drawing Sheets

(51) Int. Cl.
*H01L 29/06* (2006.01)
*H01L 29/16* (2006.01)
*H01L 29/20* (2006.01)
*H01L 29/66* (2006.01)

(52) U.S. Cl.
CPC ...... *H01L 29/1608* (2013.01); *H01L 29/2003* (2013.01); *H01L 29/66431* (2013.01); *H01L 29/66462* (2013.01)

(58) Field of Classification Search
CPC ......... H01L 29/41741; H01L 29/42316; H01L 27/092; H01L 27/085; H01L 29/7789; H01L 29/7855; H01L 29/0684; H01L 29/66795

See application file for complete search history.

(56) References Cited

U.S. PATENT DOCUMENTS

| | | | |
|---|---|---|---|
| 2014/0264379 A1* | 9/2014 | Kub | H01L 29/7782 257/77 |
| 2017/0133495 A1 | 5/2017 | Cho et al. | |

\* cited by examiner

HIGH HOLE MOBILITY TRANSISTOR (HHMT) AND METHOD OF MANUFACTURING THE SAME

FIELD OF THE DISCLOSURE

The present disclosure relates to the technical field of semiconductors, and in particular to a high hole mobility transistor (HHMT) and a method of manufacturing the same.

BACKGROUND OF THE DISCLOSURE

Group III nitride semiconductors are important semiconductor materials, including AlN, GaN, InN and compounds of these materials, such as AlGaN, InGaN, AlInGaN and the like. Due to their advantages of direct band gap, wide forbidden band and high breakdown electric field intensity, Group III nitride semiconductors represented by GaN have broad application prospects in the fields of light-emitting devices, power electronics and radio frequency devices.

Unlike conventional non-polar semiconductor materials such as Si, Group III nitride semiconductors have polarity. In other words, they are polar semiconductor materials. Polar semiconductors have many unique properties. Particularly importantly, fixed polarized charges are present at a surface of the polar semiconductor or at an interface of two different polar semiconductors. These fixed polarized charges may attract movable electrons or hole carriers, thus forming a two-dimensional electron gas 2DEG or a two-dimensional hole gas 2DHG. The generation of the two-dimensional electron gas 2DEG or two-dimensional hole gas 2DHG does not require an additional electric field, nor does it depend on a doping effect in the semiconductor. They are spontaneously generated. The two-dimensional electron gas or two-dimensional hole gas at the interface of the polar semiconductors may have a high surface charge density. Meanwhile, since doping is not required, ion scattering and other effects that the two-dimensional electron gas or the two-dimensional hole gas is subjected to are greatly reduced, and thus the mobility is high. The higher surface charge density and mobility enable the two-dimensional electron gas or hole gas spontaneously generated at such interface to have good conductivity and very high response speed.

In combination with advantages such as high breakdown electric field inherent to the nitride semiconductor itself, such two-dimensional electron gas or two-dimensional hole gas may be used to fabricate a high electron mobility transistor (HEMT) or a high hole mobility transistor (HHMT), the performances of which in high energy, high voltage or high frequency applications are significantly better than those made of traditional Si or GaAs devices. However, existing structures have many defects, which seriously restrict application ranges thereof.

BRIEF SUMMARY

In view of the problems in the related art, the present disclosure provides a high electron mobility transistor (HEMT), comprising: a vertical interface; a channel layer disposed outside of the vertical interface; a channel supply layer at least partially covering a first side of the channel layer, wherein in the channel layer a vertical two-dimensional hole gas 2DHG is formed on the first side adjacent to of the channel layer and the channel supply layer; a first electrode configured to being electronically connected to the vertical two-dimensional hole gas 2DHG; a second electrode configured to being electronically connected to the vertical two-dimensional hole gas 2DHG; and a gate electrode disposed outside of the channel supply layer.

In the high hole mobility transistor as described herein, the first side is a (000-1) panel of Group III nitride semiconductor.

In the high hole mobility transistor as described herein, the Group III nitride semiconductor is GaN.

In the high hole mobility transistor as described herein, the vertical interface is a Si (111) plane, sapphire $Al_2O_3$ (0001) plane, SiC (0001) plane or a (000-1), or (0001) plane of GaN intrinsic substrate.

In the high hole mobility transistor as described herein, the first electrode or the second electrode form an ohmic contact with the channel supply layer.

In the high hole mobility transistor as described herein, the first electrode, the second electrode, and the gate electrode are positioned on the same side of the two-dimensional hole gas 2DHG.

In the high hole mobility transistor as described herein, the first electrode, the second electrode, and the gate electrode are in the same level or in the same upright position.

In the high hole mobility transistor as described herein, the first electrode and the second electrode, and the gate electrode are positioned on the two sides of the two-dimensional hole gas 2DHG.

In the high hole mobility transistor as described herein, the first electrode extends under the channel layer.

In the high hole mobility transistor as described herein, the first electrode is a drain.

In the high hole mobility transistor as described herein, the second electrode extends above the channel layer.

In the high hole mobility transistor as described herein, the second electrode is a source.

In the high hole mobility transistor as described herein, it further comprises a nucleation layer on the vertical interface of the substrate.

In the high hole mobility transistor as described herein, it further comprises a buffer layer positioned between the nucleation layer and the channel layer.

In the high hole mobility transistor as described herein, it further comprises a screening layer formed on the side of the channel layer away from the two-dimensional hole gas 2DHG.

In the high hole mobility transistor as described herein, it further comprises an insulating layer extending under the channel layer and the channel supply layer.

In the high hole mobility transistor as described herein, it further comprises a gate insulating layer between the channel supply layer and the gate electrode.

In another aspect of the present disclosure, it provides a high hole mobility transistor (HHMT), comprising: a column including a channel layer and a channel supply layer which vertically extend on at least one side of the column, wherein a vertical two-dimensional hole gas 2DHG is formed in the channel layer adjacent to an interface between the channel layer and the channel supply layer; a first electrode contacted with the column and being electrically connected with the 2DHG; a second electrode contacted with the column and being electrically connected with the 2DHG; and a third electrode deposed on the column.

In the high hole mobility transistor as described herein, the first electrode or the second electrode is a drain or a source; and the third electrode is a gate.

In the high hole mobility transistor as described herein, it further comprises a gate insulating layer between the channel supply layer and the gate electrode.

In the high hole mobility transistor as described herein, the first electrode, the second electrode, and the third electrode are positioned on the side of the column.

In the high hole mobility transistor as described herein, the first electrode is positioned on the top of the column.

In the high hole mobility transistor as described herein, the second electrode is positioned under the bottom of the column.

In the high hole mobility transistor as described herein, the area of the second electrode is bigger than that of the bottom of the column.

In another aspect of the present disclosure, it provides a method of manufacturing a high hole mobility transistor, comprising: forming a vertical interface; forming a channel layer outside of the vertical interface; and forming a channel supply layer at least partially covering a first side of the channel layer, wherein the first side is a (000-1) panel of Group III nitride semiconductor, a vertical two-dimensional hole gas 2DHG is formed in the channel layer adjacent to an interface between the channel layer and the channel supply layer; and forming a first electrode and a second electrode being electrically connected with the two-dimensional hole gas 2DHG and a gate electrode outside of the channel supply layer.

In the method as described herein, the Group III nitride semiconductor is GaN.

In the method as described herein, the vertical interface is formed on a substrate.

In the method as described herein, a gate insulating layer is included between the channel supply layer and the gate electrode.

In the method as described herein, it further comprises transversely etching the channel supply layer or the channel supply layer and a part of the channel layer before forming a first electrode and a second ohmic contacted electrode.

In the method as described herein, it further comprises forming a nucleation layer on the vertical interface, wherein Chlorine gas is aerated while forming a nucleation layer.

In the method as described herein, it further comprises forming the second electrode and the gate electrode electrically connected to the two-dimensional hole gas 2DHG; wiping off the substrate or a part of the substrate; and forming the first electrode under the channel layer and the channel supply layer.

DETAILED DESCRIPTION OF THE EMBODIMENT(S) OF THE DISCLOSURE

Figure 1:
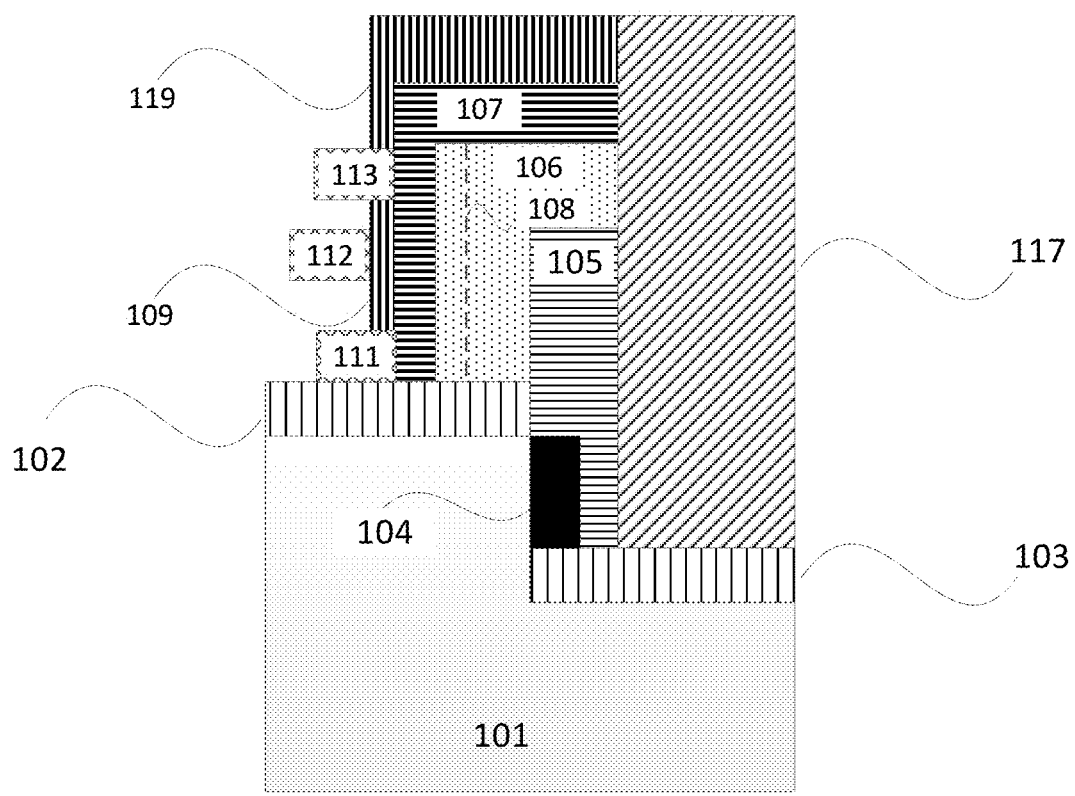
FIG. 1 is a schematic diagram of a high hole mobility transistor according to an embodiment of the present disclosure.

In order that the objects, technical solutions and advantages of the embodiments of the present disclosure will become clearer, technical solutions in the embodiments of the present disclosure will be described clearly and completely below in conjunction with the drawings in the embodiments of the present disclosure. Apparently, the described embodiments are some of the embodiments of the present disclosure, not all of them. All the other embodiments obtained by those skilled in the art based on the embodiments of the present disclosure without creative efforts will fall within the scope of the present disclosure.

In the following detailed description, reference may be made to various drawings which constitute a part of the present application and serve to explain the present application. In the drawings, similar reference signs denote substantially similar components in different figures. The individual specific embodiments of the present application will be described in sufficient detail below to enable those of ordinary knowledge and skills in the art to carry out the technical solutions of the present application. It is understood that other embodiments may be utilized, or structural, logical or electrical changes may be made to the embodiments of the present application.

The present disclosure provides a high hole mobility transistor having vertical channel structure. FIG. 1 is a schematic diagram of a high hole mobility transistor according to an embodiment of the present disclosure. As shown, the semiconductor device 100 includes a substrate 101. The substrate 101 includes two regions 120 and 130 having different heights, thereby forming a stepped structure. Thereby, a vertical interface 121 is formed between the two regions 120 and 130.

It is advantageous to forming the vertical surface 121 on the substrate 101 for design of manufacturing processes. However, the present disclosure is not limited to this implementation. In some embodiment, the vertical surface may not be formed on the substrate. For example, it is possible to form the vertical surface by vertical crystal growth or etching of existing structure on the substrate.

The lattice of the vertical surface has hexagonal symmetry. For example, the vertical surface may be a (111) plane of Si, a (0001) plane of sapphire $Al_2O_3$, a (000-1), or (0001) plane of SiC, or a (0001) plane of intrinsic GaN. Further, when the vertical surface is formed on a substrate, the corresponding substrate may be a Si substrate, a sapphire Al$_2$O$_3$ substrate, a SiC substrate, or an intrinsic GaN substrate.

The HHMT 100 further comprises a channel layer 106 and a channel supply layer 107 outside of the vertical surface 121. The channel layer 106 is closer to the vertical surface 121. In some embodiment, the channel layer 106 may be higher than the vertical surface 121. The channel supply layer 107 is grown outside of the channel layer 106. The two-dimensional electron gas 2DHG 108 is formed on the interface in the channel layer 106 adjacent to the channel supply layer 107. In some embodiments, the channel supply layer 107 is formed on a specific first side of the channel layer 106 to obtain 2DHG 108.

As described without limitation, the channel layer 106 and the channel supply layer 107 are crystal having polarity. A heterojunction is formed on the interface therebetween: a sudden change on lattice makes accumulation of polarized charges. If the polarized charges are positive, free electrons likely compensate those polarized charge. In case the interface is well, two-dimensional electron gas 2DEG is formed at the place adjacent to the interface. As the same, If the polarized charges are negative, two-dimensional hole gas 2DHG is formed at the place adjacent to the interface. As described without limitation, the polarized charges on the complementary heterogeneous surfaces of the heterojunction are in opposite polarities. Taking GaN as an example, 2DEG is formed on the heterojunction interface of the (0001) plane of GaN and AlGaN; and 2DHG formed on the heterojunction interface of the (000-1) plane of GaN and AlGaN.

In some embodiments, the first side is (000-1) plane of the GaN. Of course, other crystals other than GaN which can produce heterojunction, including without limitation Ga/GaAs, InGaP/GaAs, etc. can also be applied in the present disclosure.

In some embodiment, the HHMT 100 further includes a nucleation layer 104. The nucleation layer 104 is grown on the vertical interface 121. For example, the nucleation layer 104 may be AlN. In some embodiment, the HHMT 100 further includes a buffer layer 105 which is grown on the nucleation layer 104. For example, the buffer layer 105 may be in structure of one layer or multiple layers, including one or more of AlN, GaN, AlGaN, InGaN, AlInGaN. The channel layer 106 is grown on the nucleation layer 104 or the buffer layer 105.

The HHMT 100 comprises a first electrode 111, a second electrode 113 and a third electrode 112. The first electrode 111 and the second electrode 113 have ohmic contract with the channel layer 106 or channel supply layer 107, and thereby is electronically connected with the 2DHG 108.

In some embodiment, the first electrode 111, as a drain, is provided on one side of the channel layer 106 or channel supply layer 107 adjacent to the substrate 101. The second electrode 113, as a source, is provided on one side of the channel layer 106 or channel supply layer 107 away from the substrate 101. In general, the first electrode, as the drain, is connected with high voltage; and the second electrode, as the source, is away from the first electrode, which is advantageous for increase of withstanding voltage and reduction of loss.

The third electrode 112, as a gate, is provided outside of the channel supply layer 107. The third electrode 112, also called the gate electrode, controls current intensity in the channel area between the first electrode 111 and the second electrode 113. In some embodiment, the third electrode 112 forms a Schottky contact with the channel supply layer 107.

In some embodiments, the third electrode 112 also include other layers, for example a cap layer, a gate insulating layer, etc. The third electrode is contacted with the cap layer or the gate insulating layer, but is not directly contacted with the channel supply layer 107. The voltage of third electrode 112 may control the depth of heterojunction potential well formed by the channel layer-channel supply layer and the surface charge density of 2DHG in the potential well, and thereby control working current between the first electrode 111 and the second electrode 113 in the HHMT 100.

Preferably, the third electrode 112 is between the first electrode 111 and the second electrode 113, more adjacent to the second electrode 113. In the condition that the first electrode 111, as the drain, is connected with high voltage, such arrangement increases the distance between the drain and the gate, which can effectively increase the withstanding voltage of the high hole mobility transistor.

FIG. 1 shows an arrangement of the three electrodes of the HHMT 100. The first electrode 111 is positioned below, the third electrode 112 is positioned above the first electrode 111, and the second electrode 113 is positioned above the second electrode 113. That is, they have the same upright position. Only the second electrode 112 can be observed when viewed from the top of the substrate. This arrangement can maximumly reduce chip area and increase integrity. In some embodiment, the first electrode 111, and the second electrode 113, and the third electrode 112 are arranged horizontally and having the same level height. This arrangement may facilitate the lead connection. Either the first electrode 111 or the second electrode 113 may be the drain or source.

As shown in FIG. 1, the first electrode 111 and the second electrode 113 are positioned outside of the channel layer 106. In some embodiment, the first electrode 111 and the second electrode 113 may extend respectively on the top and bottom two sides of the channel layer 106.

In some embodiments, a first spacing layer 102 is included between the substrate 101 and the channel layer 106 and channel supply layer 107. The spacing layer 102 extend horizontally and its material may be insulating material such as SiO$_2$ and so on. The spacing layer 102 has the HHMT 100 spaced from the substate 101, which can avoid influence on the device from the substate 101 and make the capability of increasing withstanding voltage and reducing dark current of the device obviously improved.

In some embodiments, a second spacing layer 103 is included between the substrate 101 and the other structure other than the substrate 101. The second spacing layer 103 extend horizontally and its material may be insulating material such as SiO$_2$ and so on. The second spacing layer 103 has the HHMT 100 spaced from the substate 101, which can avoid influence on the device from the substate 101 and make the capability of increasing withstanding voltage and reducing dark current of the device obviously improved.

In some embodiments, a screening layer 117 is included on the second side of the channel layer 106 away from the 2DHG 108. The first and second sides of the channel layer 106 are opposite and the first side is adjacent to the 2DHG 108. The existence of the screening layer 117 makes no two-dimensional electron gas 2DEG on this side of the channel layer 106. In some embodiments, the screening layer 117 occupied most or all of the area on the side of the channel layer 106 away from the 2DHG 108 between the first electrode 111 and the second electrode 113 and thereby has the channel layer 106 spaced from the substrate 111 on the horizontal direction. This may further avoid the influence on the device performance by the substrate 101.

In some embodiments, the screening layer 117 may envelop or partially envelop the channel layer 106 and channel supply layer 107. For example, the screening layer 117 may extend on the top of the channel layer 106 and channel supply layer 107. Or, the screening layer 117 may further cover the channel layer 106 and channel supply layer 107. This will further have the HHMT 100 spaced and reduce the influence of other environment materials. In some embodiments, the screening layer 117 may be insulating material such as SiO$_2$ and so on. It is of obvious helpful to have the HHMT 100 spaced by the screening layer 103 on capability of increasing withstanding voltage and reducing dark current.

In some embodiments, a gate insulating layer 109 is included between the channel supply layer 107 and the third electrode 112. The gate insulating layer 109 has the third electrode 112 spaced from the channel supply layer 107, which may reduce leak current between the third electrode 112 and the first electrode 111. Meanwhile, the gate insulating layer 109 may passivate the surface of the channel supply layer 107 and make the high hole mobility transistor working more steadily.

In some embodiments, a cap layer (for example AlN or GaN) is included between the channel supply layer 107 and the third electrode 112. In some embodiments, a passivation layer 119 may be included on the channel supply layer 107. For example, the passivation layer 119 may occupy a portion covering the channel supply layer 107 between the first electrode 111 and the second electrode 113 and a portion covering the third electrode 112 and thereby provide protection to the internal channel layer 106 and channel supply layer 107. In some embodiments, the outer insulating layer 119 may be insulating material such as SiN, SiO$_2$ and so on. The cap layer and the passivation layer are helpful to reduce drain current collapse and maintain 2DHG produced by polarity. Meanwhile, they can also reduce a leak current of the gate, avoid cracking during the temperature decrease after growth of the channel supply layer 107 and increase ohmic contacts of the source and drain and breakdown voltage.

According to an embodiment of the present disclosure, the substrate 101 material may be Si, SiC, intrinsic GaN or sapphire Al$_2$O$_3$. In some embodiments, the Si substrate is selected with a more mature process and lower cost than other materials. Si in the substrate will have a melt-back effect with GaN in channel layer 106, which will affect the growth of channel layer 106. Therefore, the nucleation layer 104, whose material can be AlN, is introduced to cover the vertical interface 121 of the Si substrate 101, so as to avoid the direct contact between Si in the Si substrate 101 and GaN in channel layer 106. The nucleation layer 104 may also exist but is not required when the substrate is a non-Si material.

In some embodiments, when the substrate 101 is a non-intrinsic GaN substrate, a buffer layer 105 is preferably introduced to reduce the impact of lattice differences. Buffer layer 105 can be one or more of AlN, GaN, AlGaN, InGaN, AlInN and AlGaInN, which can reduce the impacts of lattice constant and thermal expansion coefficient between the substrate 101 and channel layer 106, and effectively avoid nitride epitaxial layer cracking and other conditions. The buffer layer 105 is also an optional structure for the HHMT 100.

According to an embodiment of the present disclosure, the material of channel layer 106 may be GaN. According to an embodiment of the present disclosure, the material of the channel supply layer 107 may be AlGaN. The channel layer 106 and channel supply layer 107 may also be other materials as understood by persons skilled in the art as mentioned in the background, which is not repeated here.

Due to spontaneous polarization and piezoelectric polarization effects, there are strong polarization charges at the interface between channel layer 106 and channel supply layer 107. Those polarized charges attract and cause generation of 2DHG at the interface. In some embodiments, the vertical interface 121 is the (111) plane of Si substrate, and the (0001) plane of GaN, etc. The channel layer is GaN and the channel supply layer 107 is only formed on the left of the channel layer 106, i.e. the (000-1) plane of the GaN. This will form the HHMT 100 only having 2DHG 108. For example, the vertical surface 121 is the (111) plane of Si, the (0001) plane of GaN, etc. The channel supply layer 107 is formed on both left and right sides of the channel layer 106. The high hole mobility transistor having 2DHG and other structures is formed on the left and the high electron mobility transistor having 2DEG and other structures is formed on the right. As understood by persons skilled in the art, these changes are all within scope of the In some embodiments, it is more advantageous to implement a HHMT that includes only 2DHG. For example, in the structure shown in FIG. 1, removal of 2DEG will prevent 2DEG from responding to potential changes at respective electrodes, makes no increase in parasitic capacitance and leakage channels, and reduces leakage current of the HHMT. Therefore, the HHMT 100 with the structure described in FIG. 1 has better working stability. In some embodiments, in order to manufacture this structure, the stepped structure formed by substrate 101 and shield 103 can be made high enough to manufacture the nucleation layer 104, buffer layer 105, channel layer 106, channel supply layer 107 and so on.

In some embodiments, the material of the spacing layer 102, the second spacing layer 103, the gate insulation layer 109 and outer insulating layer 119 may be formed from at least one kind of insulating material such as silicon oxide, silicon nitride oxide or silicon nitride and may also have a single-layer or multi-layer structure.

As shown in some embodiments of the present disclosure, a HHMT comprising a 2DHG formed in the vertical direction has a number of excellent properties. First of all, the voltage withstanding capacity of HHMT is greatly improved. Even using a Si substrate with lower cost and more mature technology, the voltage withstanding capacity of HHMTs is close to that of HHMTs on the intrinsic GaN substrate. Secondly, the contact area between the vertical channel device of the present disclosure and the substrate is comparably small, which may keep the influence of the substrate small and make it easy to overcome the problems such as the epitaxial layer cracking of the traditional planar device. Furthermore, by increasing arrangement density of the vertical channels, the conductive area of the device can be increased, and the substrate area can be used more adequately.

It should be appreciated the above description is only an illustrative embodiment of the structure of the HHMT. The HHMT also have a variety of other structures or modifications, changes, or variants on these structures to provide different properties or functions. These structures and their improvement, alteration or variation may also be applied to the scheme of the disclosure under the technical conception of the disclosure.

Figure 2A:
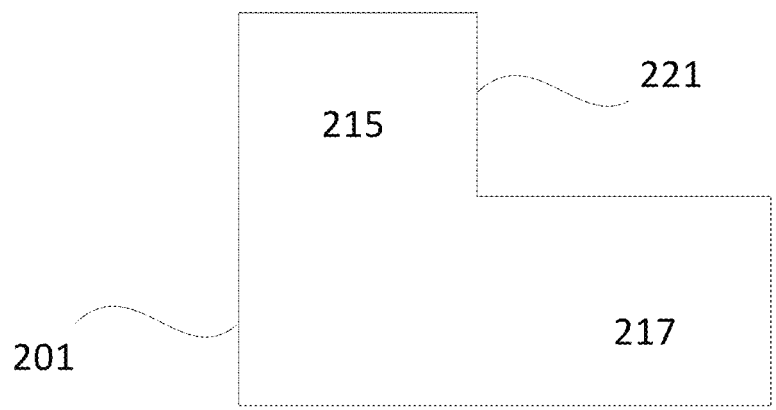
FIGS. 2A-2Q are flow charts of a method of manufacturing a high hole mobility transistor according to an embodiment of the present disclosure.

The disclosure also provides a manufacturing method for a HHMT. FIGS. 2A-2Q are flow charts of a method of manufacturing a HHMT according to an embodiment of the present disclosure. In this embodiment, the device manufactured on an Si substrate is taken as an example. Similar structures can be achieved with other substrates such as intrinsic GaN, Al$_2$O$_3$ (sapphire), SiC, etc., as understood by persons skilled in the art.

As shown in the figures, HHMT manufacturing method 200 comprises the following steps: in step 210, forming a vertical interface 221 on the substrate 201 as shown in FIG. 2A. Accordingly, a first area 215 and a second area 217 of different height are formed on the substrate 201. The vertical interface 221 is between the first area 215 and the second area 217.

Figure 2B:
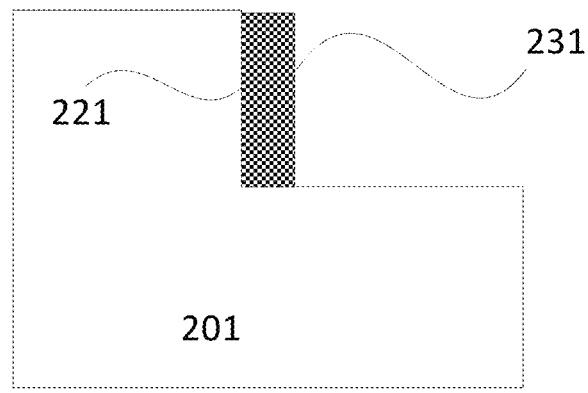

In step 220, a protective layer is grown on the substrate to cover the vertical surface 221, as shown in FIG. 2B. In some embodiments, SiN is grown on substrate 201 using techniques such as LPCVD to cover substrate 201. Then, through vertically oriented etching technique, only SiN at the vertical interface 221 is retained, forming the protective layer 231. The protective layer 231 covers the vertical interface of the substrate.

Figure 2C:
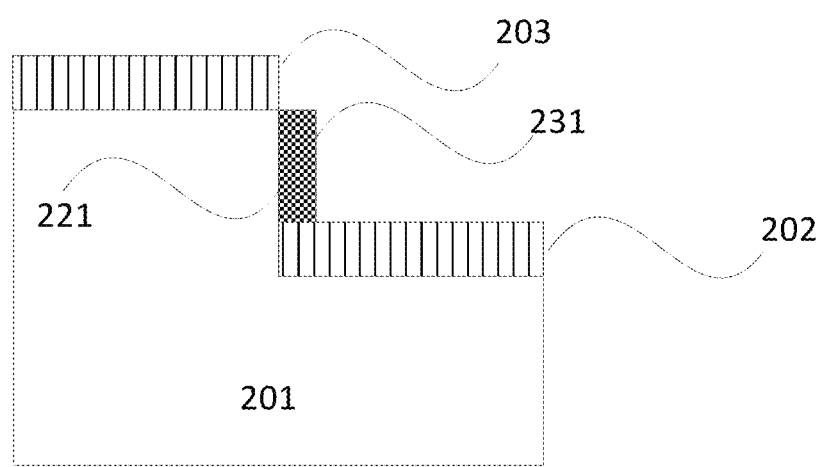

In step 230, a second spacing layer 202 and a spacing layer 203 are formed above the substrate 201, as shown in FIG. 2C. The substrate is covered with the second spacing layer 202 and the spacing layer 203. In some embodiments, SiO$_2$ can be grown by oxidation techniques to form an insulating layer over the substrate 201. Since the vertical interface 221 of substrate 201 is covered with a protective layer 231, the vertical interface 221 of substrate 201 has virtually no isolation layer 202 and shielding layer 203 growing on it. The insulation layer above the first area 215 is then covered with a mask, and the insulation layer on the second area 217 is partially etched by photolithography to reduce the height of the insulation layer on the second area 217, while ensuring that the insulation layer is still covered on the second area 217. This results in a higher isolation layer 202 and a lower shielding layer 203 on the substrate 201. Persons skilled in the art should understand that other methods of forming the second spacing layer and the spacing layer can also be applied here.

Figure 2D:
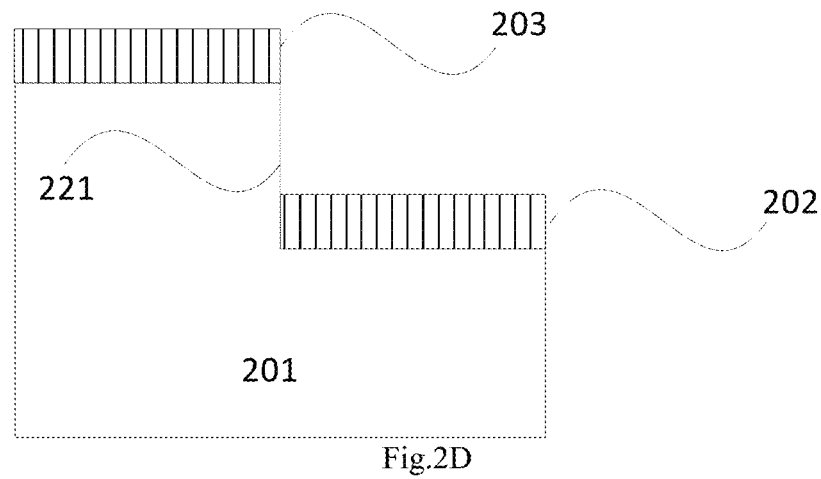

In Step 240, the protective layer is removed as shown in FIG. 2D. In some embodiments, SiN on the vertical interface 221 was removed by selective etching Therefore the vertical interface 221 on substrate 201 is exposed and the second spacing layer 202 and the spacing layer 203 are retained on substrate 201.

It should be appreciated that there are other techniques to form isolation and shielding layers on the substrate and expose the vertical interface of the substrate. For example, an insulating layer can be grown on horizontal substrates. Then, a portion of the insulating layer is covered with a mask, and the insulating layer and substrate are etched by photolithography so that the first area 215 and the second area 217 of the substrate is formed, wherein area 215 is covered by the insulating layer and the second area 217 and the vertical interface 221 are exposed. A protective layer is then formed over all exposed surfaces. The protective layer on the second area 217 is then etched in an anisotropic etching manner and the protective layer on the vertical interface 221 is retained. Another insulating layer is then formed on the surface of the second area 217, and then selectively etched the protective layer. This will expose the vertical interface 221 with the first area 215 and the second area 217 covered by the insulating layer respectively.

Figure 2E:
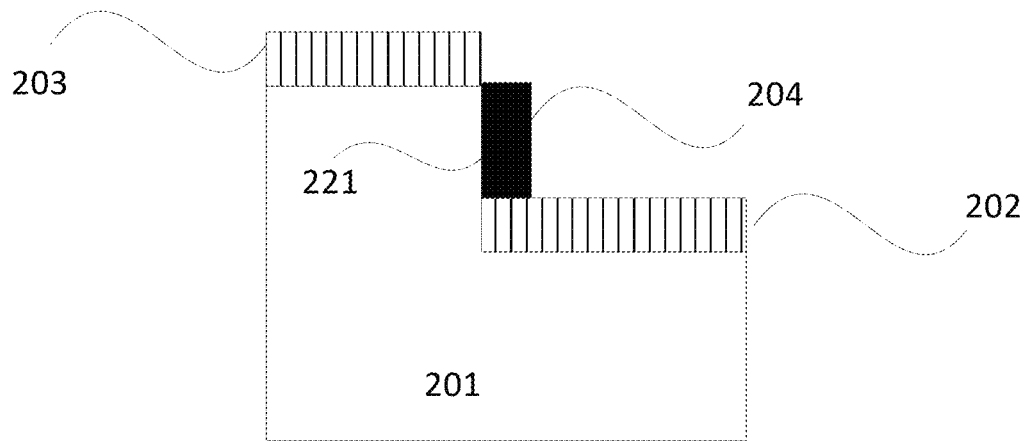

In Step 250, a nucleation layer 204 is formed on the exposed vertical surface 221 of the substrate 201, as shown in FIG. 2E. For the Si substrate, AlN is used in the nucleation layer 204 due to the melt-back effect of Ga atoms. As is known to persons skilled in the art, GaN can be directly nucleated at Al$_2$O$_3$ (sapphire), SiC or intrinsic GaN, but crystal quality control is difficult. Therefore, the nucleation layer 204 in general is introduced processes. In some cases, the nucleation layer 204 such as low temperature GaN or AlN in step 205 may not be necessary to introduce.

The capacity of regional selective formation, e.g., growth, of AlN is weak. As a result, there may be some growth in the second spacing layer 202 and the spacing layer 203, which will have an adverse effect on the semiconductor devices. In some embodiments, the wafer can be taken out after AlN is grown. The AlN nucleation layer on the vertical surface can be retained by etching with anisotropy, while the AlN in other places can be removed, for example, by dry etching using vertical downward ion bombardment. Since the AlN on the vertical surface is less bombarded by ions and the AlN on other surfaces is more bombarded, only AlN on the vertical surface preserved can be achieved.

In some embodiments, the desire to remove AlN from the second spacing layer 202 and the spacing layer 203 may also lead to aeration of corrosive gases, such as chlorine or chlorinated gas, during the formation of the nucleation layer. Due to the amorphous or polycrystalline structure of the second spacing layer 202 and the spacing layer 203, AlN is more difficult to nucleate at the second spacing layer 202 and the spacing layer 203 in a chlorine atmosphere. In addition, even if AlN attachment appears in the second spacing layer 202 and the spacing layer 203, the AlN attached to the second spacing layer 202 and the spacing layer 203 are also amorphous or polycrystalline. The chlorine gas has a strong corrosive effect on them and the AlN attached will be etched away by chlorine gas. The AlN of the nucleation layer is a single crystal structure, which is weakly corroded by chlorine. The AlN of the nucleation layer can grow well under the chlorine atmosphere. Therefore, this method can also realize the selective growth of the nucleated layer.

Figure 2F:
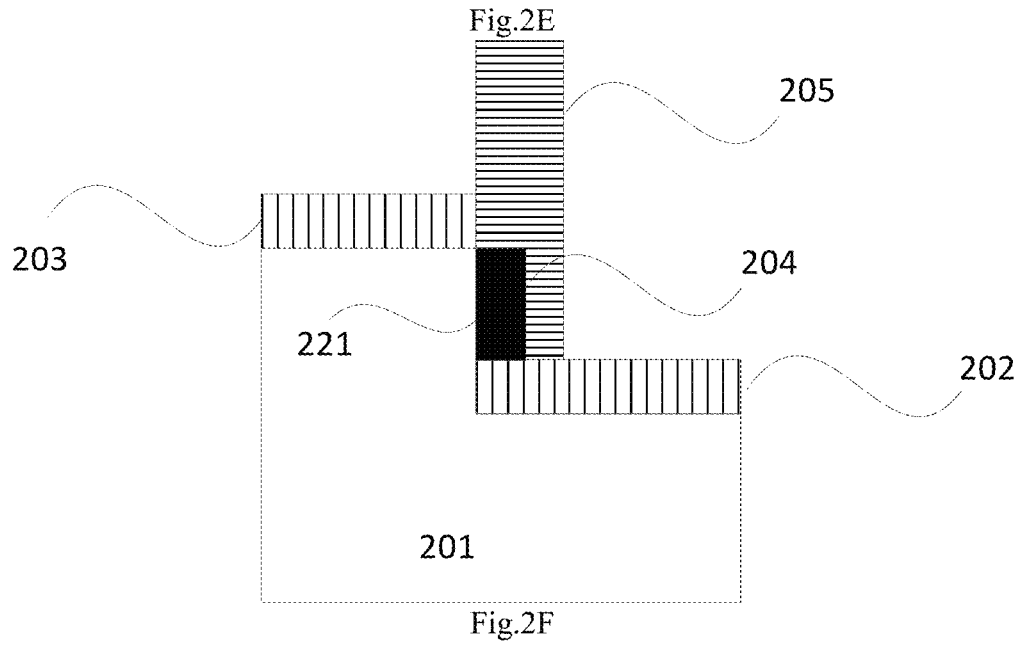

In Step 260, a buffer layer is formed on the nucleation layer, as shown in FIG. 2F. The buffer layer 205 is formed by epitaxial growth on nucleation layer 204. As mentioned herein, the buffer layer is not necessary in the structure of some semiconductor devices of the present disclosure. In essence, the buffer layer and the channel layer are very similar in nature and can even be the same material. In other words, the basic structure is the channel layer/channel supply layer, and there can be a buffer layer between the channel layer and the nucleation layer.

Figure 2G:
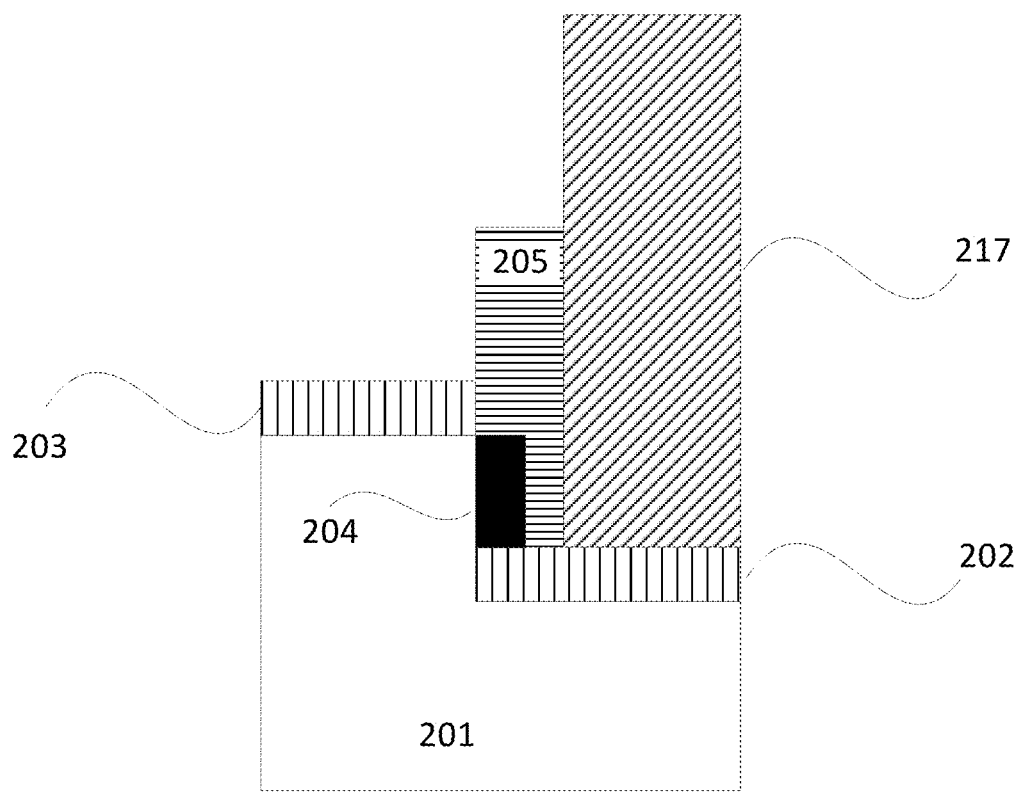

In Step 270, a screening layer is formed on the substrate, as shown in FIG. 2G. An insulating layer is entirely covered the formed structure by growth of SiO$_2$ with film deposition technology. Then, a part of the insulating layer is removed by selective etching and only the part on the right of the vertical surface is retained, which forming the screening layer 217. In some embodiments, the retained screening layer 217 is higher than the buffer layer 205.

Because of hexagonal symmetry of the vertical surface, directly growth of the channel layer and the channel supply layer will make the device including both 2DEG and 2DHG inside. Forming the screening layer on one side above the substrate may avoid undesired 2DEG or 2DHG formed inside. In some embodiments, there are other ways to forming the screening layer. For example, a screening layer is formed at first on one side of the vertical surface before removal of the protective layer, the protective layer is then removed to expose the vertical surface of the substrate, and the nucleation layer and the buffer layer are formed.

Figure 2H:
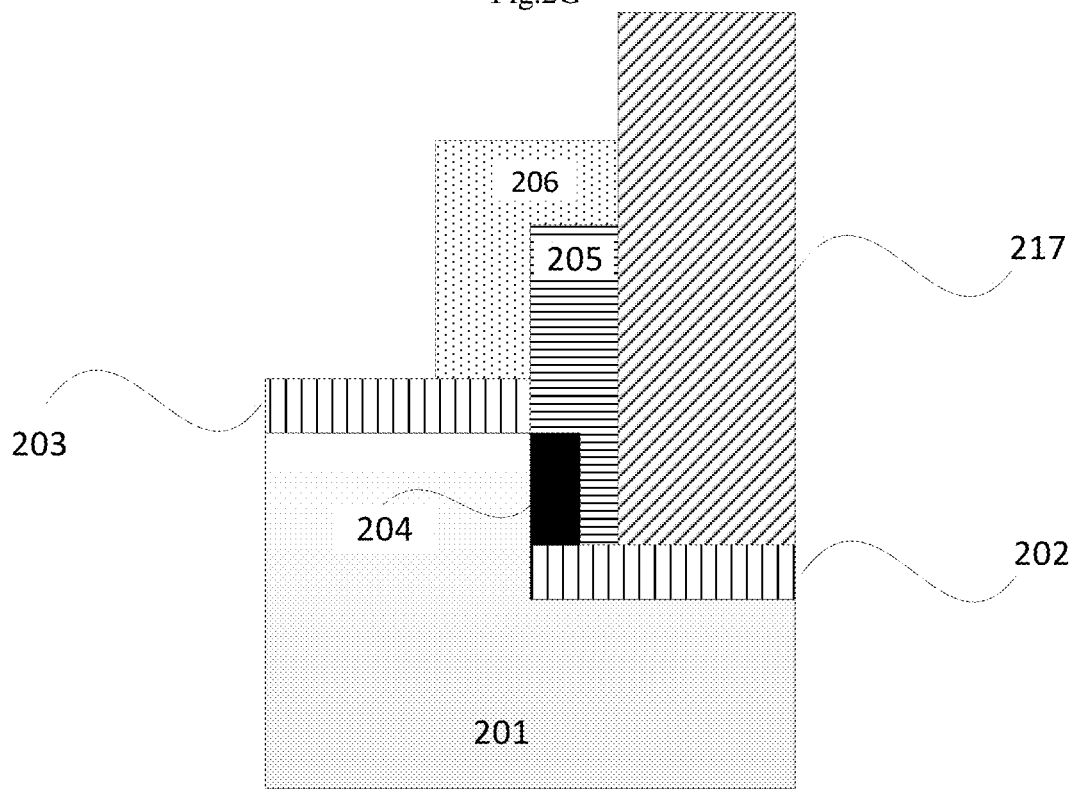

In Step 280, a channel layer is formed on the buffer layer, as shown in FIG. 2H. In some embodiments, the channel layer 206 is lower than the screening layer 217. For example, the channel layer 206 is formed by epitaxial growth on buffer layer 205. Because the right side of the channel layer is blocked by the screening layer 217, only the vertical surface on the left is exposed. In some embodiments, the exposed vertical surface is the (000-1) plane of the GaN.

Figure 2I:
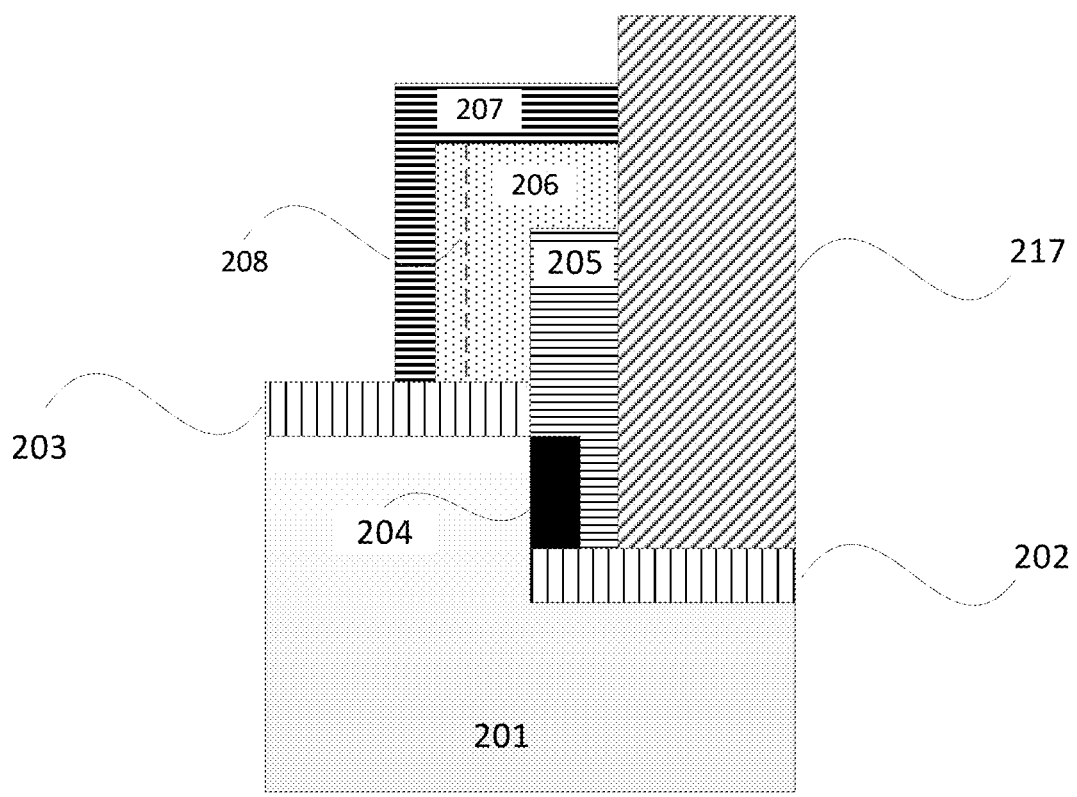

In Step 290, a channel supply layer is formed on the channel layer, as shown in FIG. 2I. For example, the channel supply layer 207 is formed by epitaxial growth on the channel layer 206. The channel supply layer 207 covers the top surface of the channel layer 206 and the left exposed vertical surface of the channel layer 206. On the right, there is no channel supply layer grown because of blocking by the screening layer 217.

Channels are generated at the interface of nitride semiconductor with narrow/wide band gap width. They are located in the channel layer with low band gap width and near the interface of channel layer/channel supply layer. The most common example is the GaN/AlGaN interface. That is, the channel layer 206 is GaN and the channel supply layer 207 is AlGaN. Because the left of the channel layer is the GaN (000-1) plane, the carriers formed in the channel are holes. The holes flow mainly in the channel and have high mobility and charge density, which forms two-dimensional hole gas 2DHG.

Figure 2J:
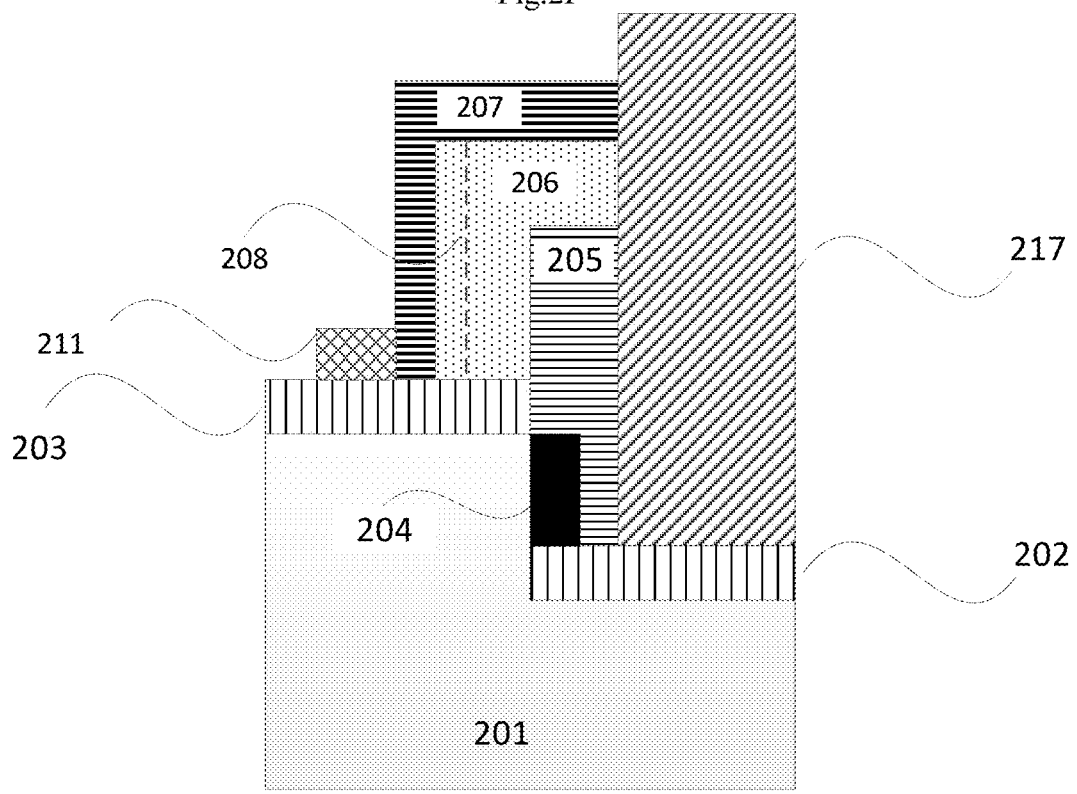

In step 2100, the first electrode 211 is formed on the insulating layer 202, as shown in FIG. 2J. In some embodiments, the channel supply layer 207 and part of the channel layer 206 which is defined as drain area may be etched and the first electrode 211 may then be formed in the exposed area. Electrode deposition methods may be used, such as electron beam evaporation physical deposition or electrochemical deposition methods. The first electrode 211 is in ohmic contact with channel layer 206 and can be electrically connected with 2DHG. In some embodiments, partial etching may not be required. The first electrode 211 is formed on the part of the channel supply layer 207 that defines the drain area. The first electrode 211 is in ohmic contact with the channel supply layer 207 and can also be electrically connected with 2DHG.

Usually, the material of the first electrode is metal. In some embodiments, in addition to the deposition at the bottom, a small amount of deposition on the side may occur during the deposition of the first electrode. The undesired deposition of the metal layer on the side wall may be removed by isotropic etching.

Figure 2K:
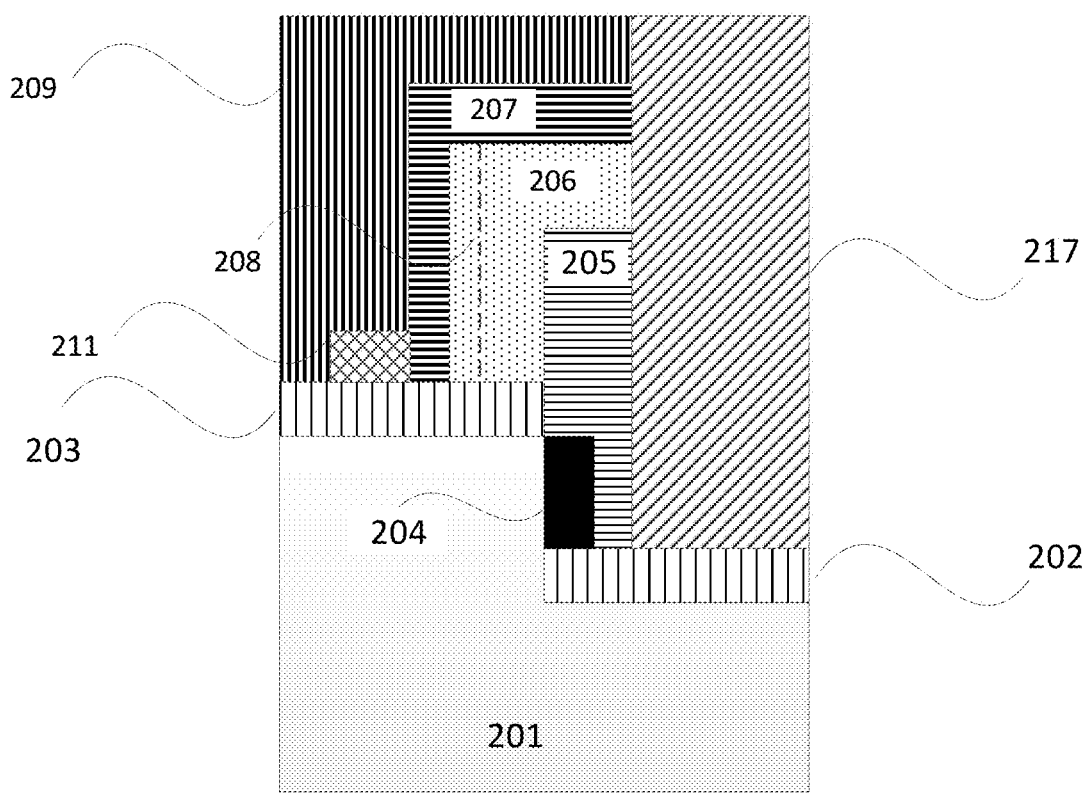

In step 2110, a passivation layer 209 is formed, covering the channel supply layer 207 and first electrode 211, as shown in FIG. 2K. Besides the channel supply layer 207, an insulating layer 209 can be formed on the channel supply layer 207 by means of material deposition, for example the SiO$_2$ growing by CVD technology.

Figure 2L:
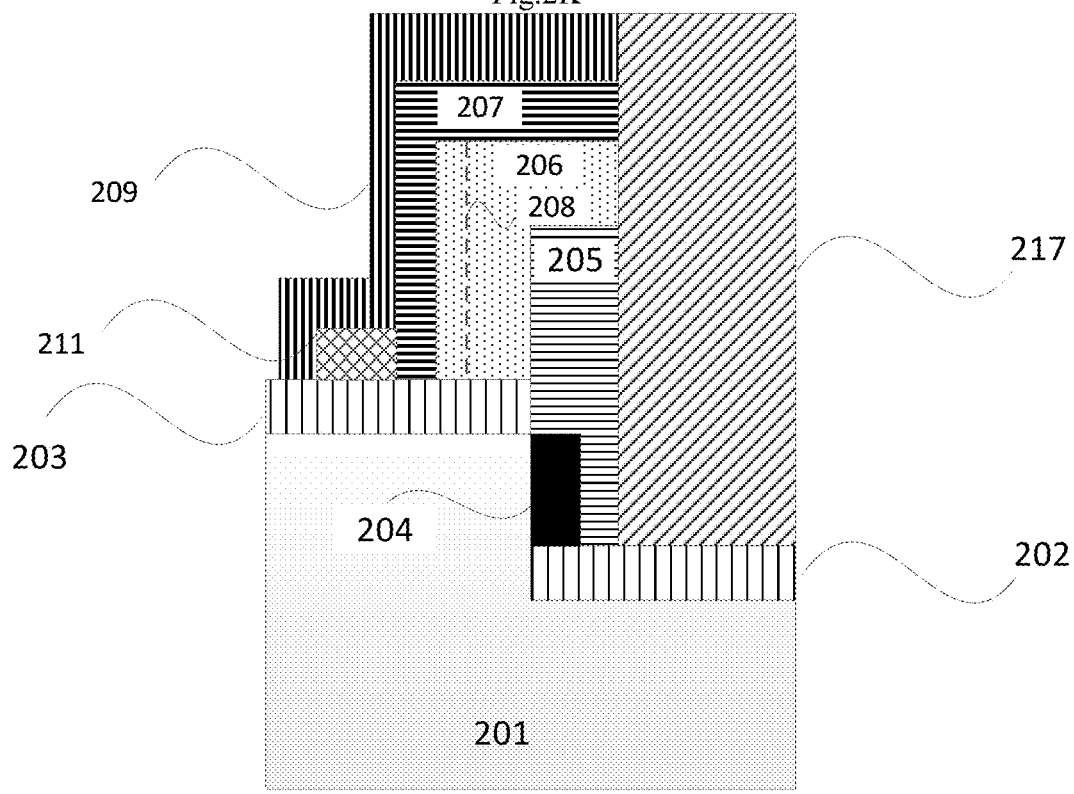

In Step 2120, the passivation layer 209 above the gate electrode area is removed as shown in FIG. 2L. In some embodiments, the passivation layer above the gate electrode area can be completely removed, exposing the channel supply layer 207 above the gate electrode area. In other embodiments, a part of the passivation layer may be retained without exposing the channel supply layer 207. After the formation of the gate electrode, the passivated layer between the channel supply layer 207 and the gate electrode becomes a gate insulation layer.

Figure 2M:
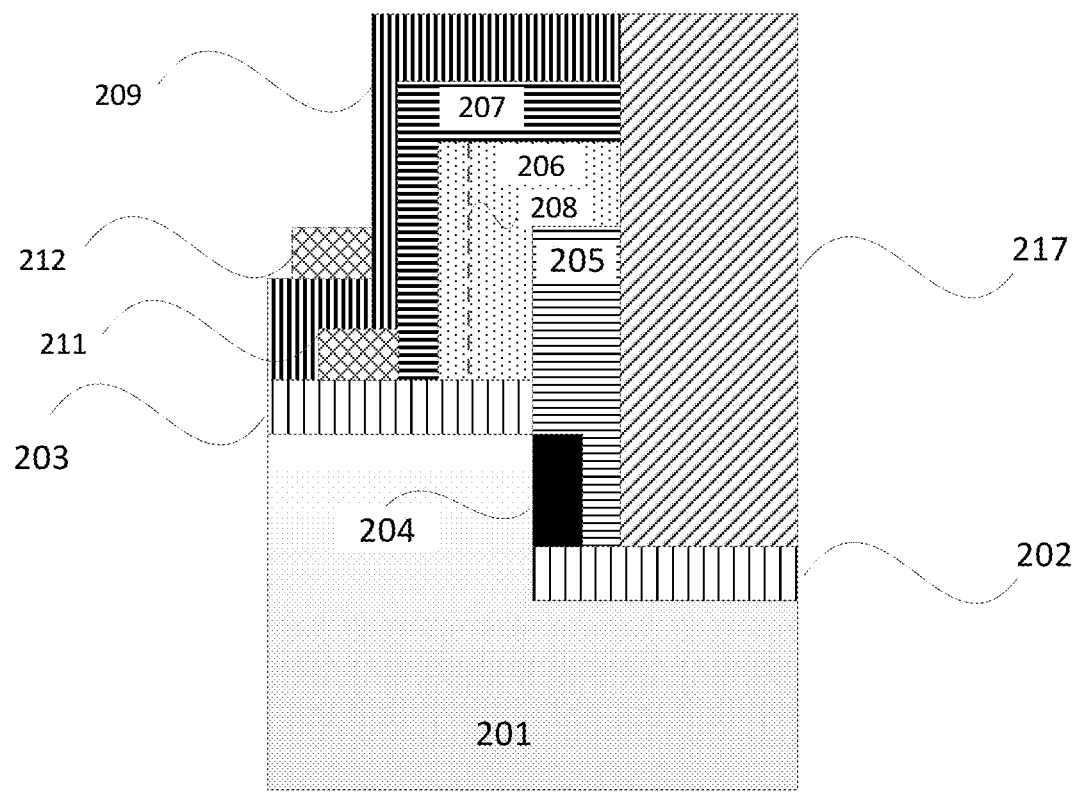

In Step 2130, a third electrode 212 is formed on the passivation layer 209, as shown in FIG. 2M. The third electrode 212 is provided as a gate outside of the channel supply layer 207. The Schottky contact is formed between the third electrode 212 and the gate insulating layer or channel supply layer 207. A third electrode may be formed by, such as, the electron beam evaporation physical deposition or by electrochemical method.

The material of the third electrode is usually metal. In some embodiments, in addition to the deposition at the bottom, there may be a small amount of deposition on the side during the deposition of the third electrode. The undesired metal layer deposition on the side wall may be removed by the isotropic corrosion.

Figure 2N:
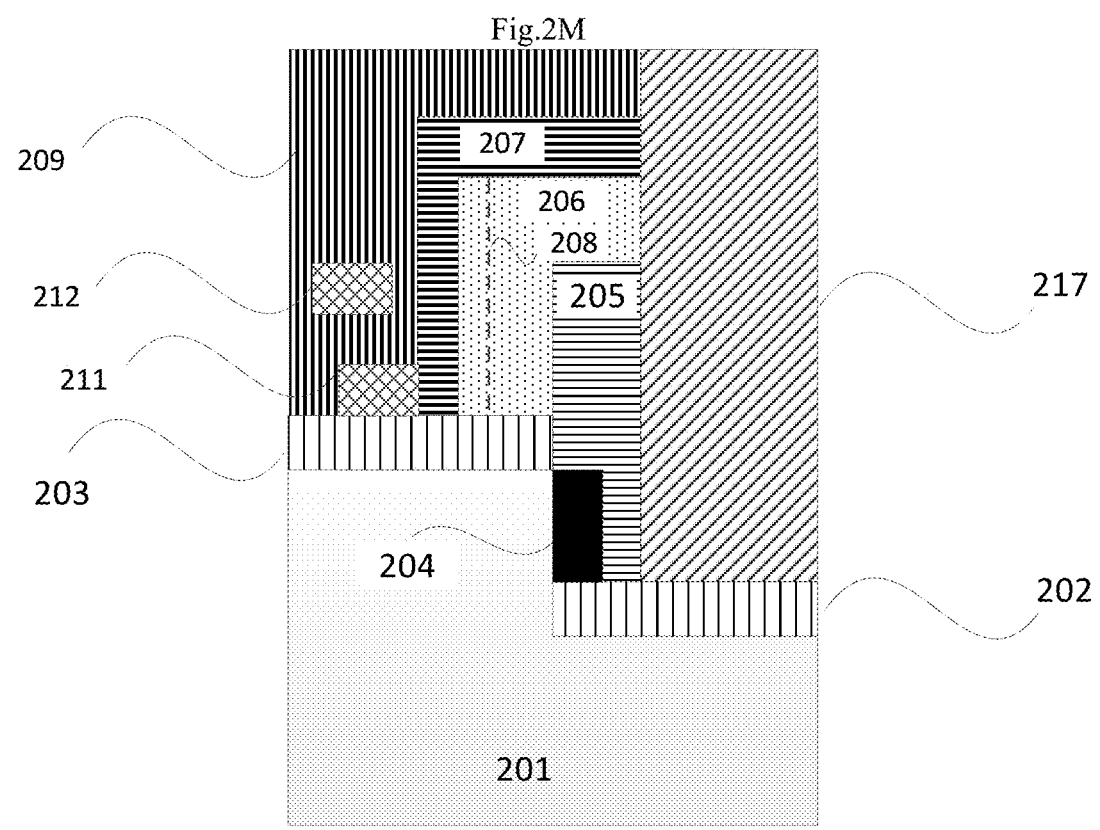

In Step 2140, a passivated layer 209 is formed, covering the third electrode, as shown in FIG. 2N. In some embodiments, the passivated layer 209 can be formed by CVD deposition, such as SiO$_2$ growing by CVD deposition, covering the third electrode.

Figure 2O:
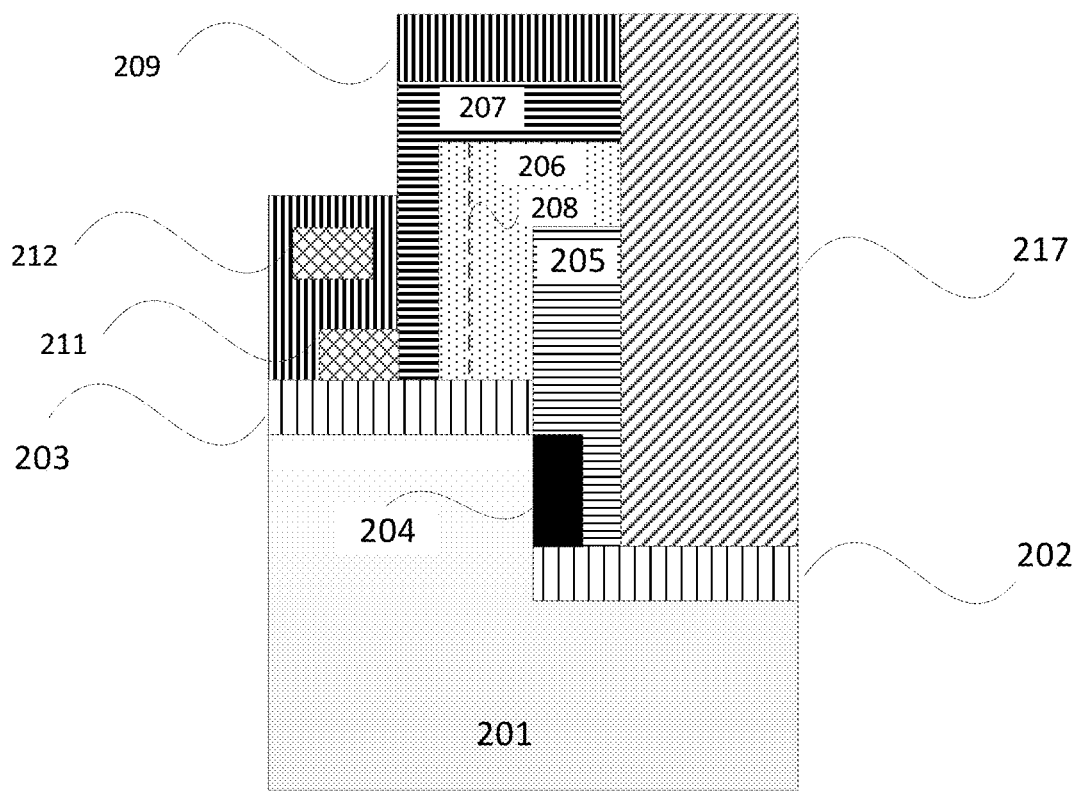

In Step 2150, the passivation layer 209 above the location of the first electrode area is removed, as shown in FIG. 2O. Similar to Step 2110, the selective etching is used to exposes the passivation layer above the location of the first electrode area, while retaining a part of the insulation layer outside of the channel supply layer.

Figure 2P:
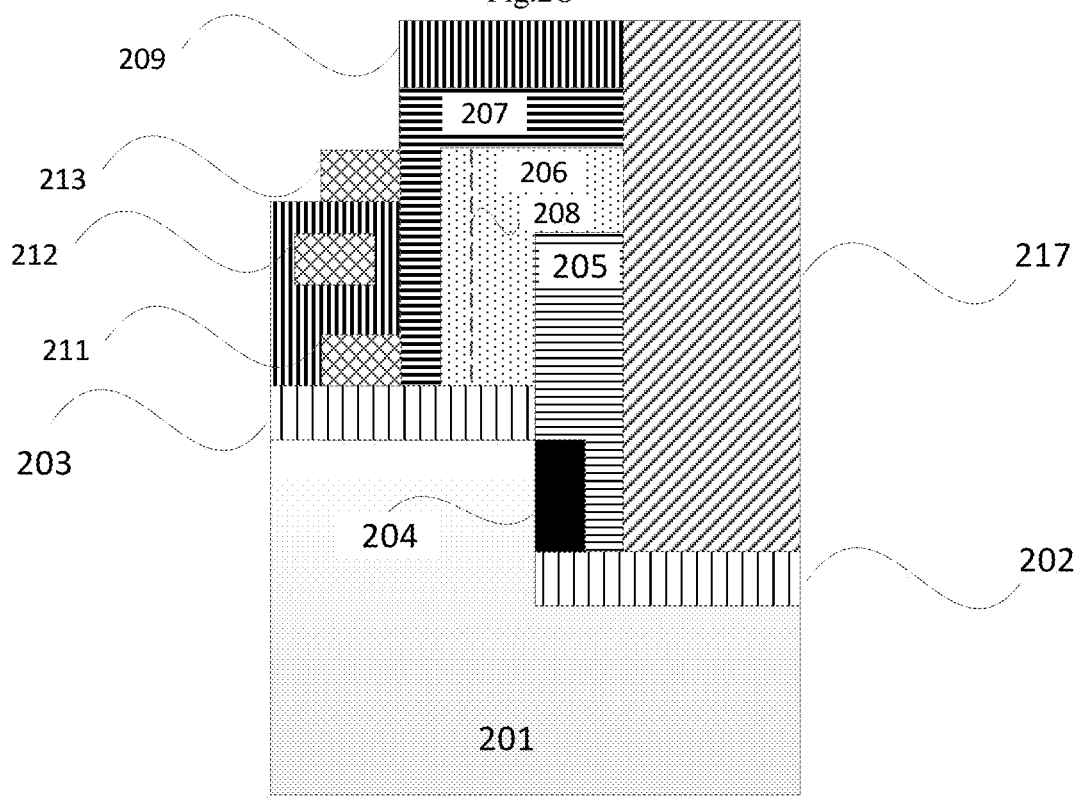
Figure 2Q:
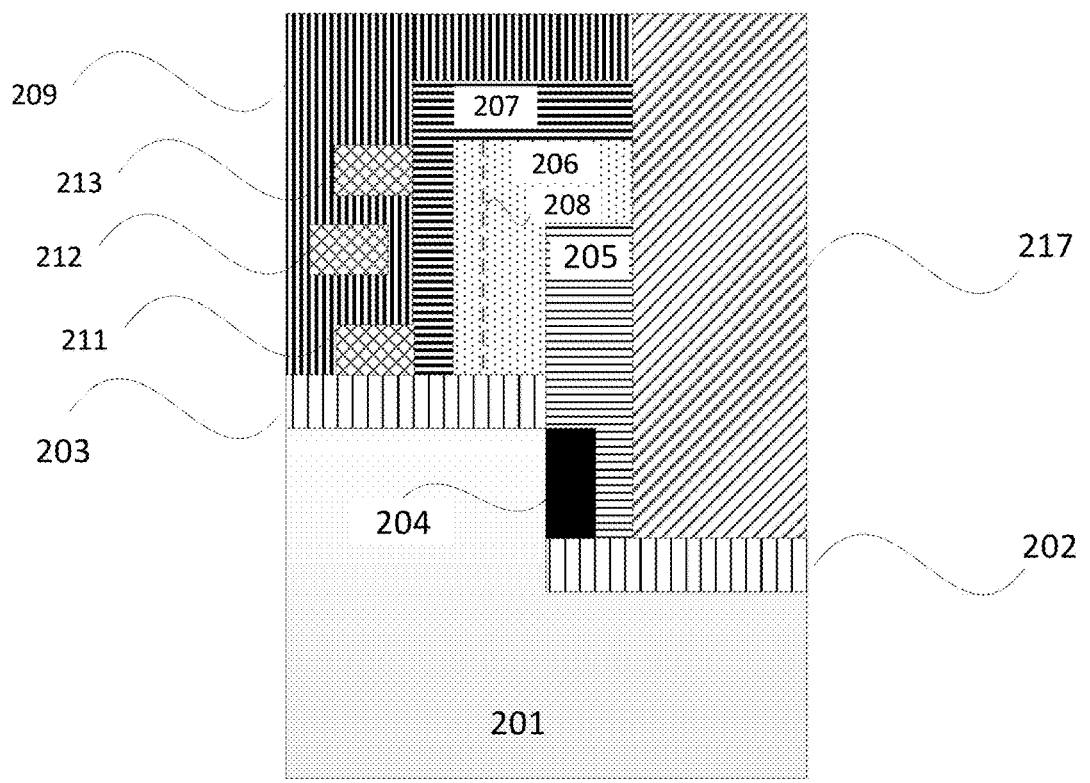

In Step 2160, a second electrode 213 is formed on the passivation layer 209, as shown in FIG. 2P. Similar to Step 290, the passivation layer 209 and the channel supply layer 207 or a part of the channel layer 206 at the position corresponding to the source electrode are etched, and the second electrode 213 can be formed outside of the exposed channel layer 206. Electrode formation methods, such as electron beam evaporation physical deposition or electrochemical methods, may be used. The second electrode 213 has ohmic contact with channel 206 and can be electrically connected with 2DHG.

The second electrode material is usually metal. In some embodiments, in addition to the deposition at the bottom, there may be a small amount of deposition on the side during the deposition of the second electrode. The undesired deposition on the side wall may be removed by the isotropic corrosion.

In step 2170, a passivation layer 209 is formed and the second electrode 213 is coated, as shown in FIG. 2Q. In some embodiments, the passivated layer 209 may be formed by CVD deposition, such as, SiO$_2$ growing by CVD deposition.

In some embodiments, when an insulating layer is formed over a channel supply layer, it may be formed in-situ in the same growth device after the epitaxial growth of a nitride semiconductor, such as, the SiN insulating layer may be grown in situ. Alternatively, the growing may be done after the wafer is taken out.

Figure 3:
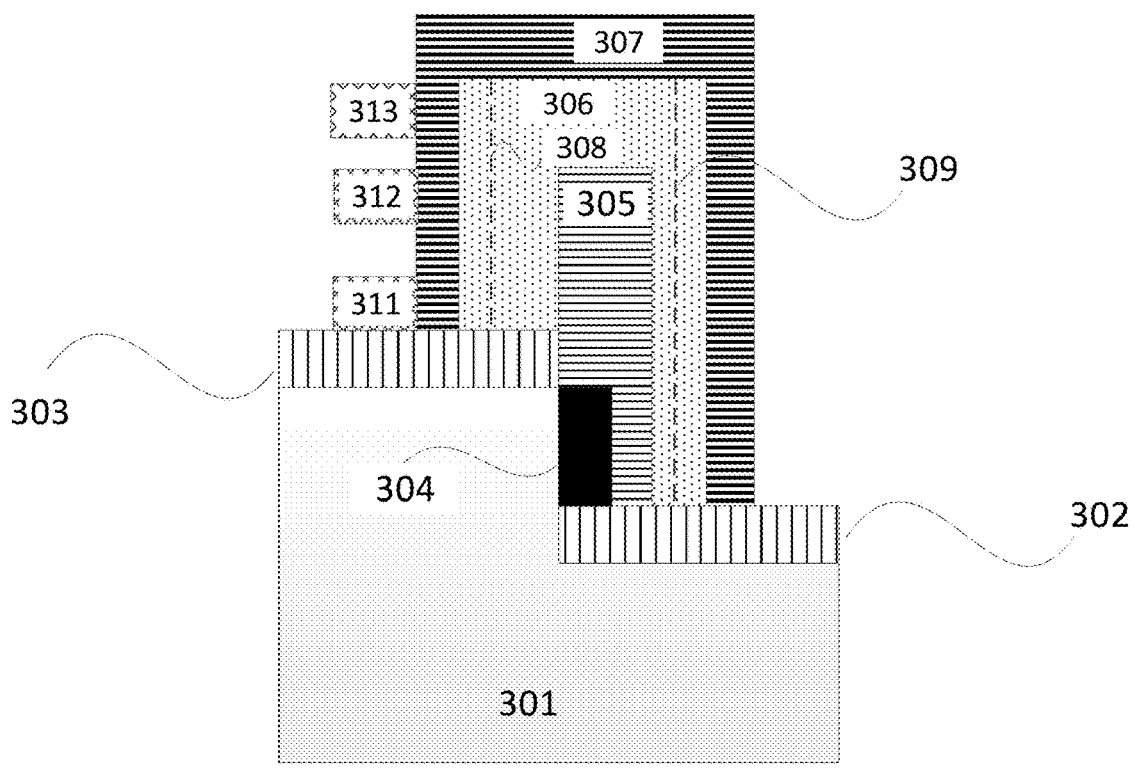
FIG. 3 is a schematic diagram of a high hole mobility transistor with Si substrate according to an embodiment of the present disclosure.

FIG. 3 is a schematic diagram of a HHMT according to an embodiment of the present disclosure. In the embodiment in FIG. 3, The 2DEG is also formed on the other side of the channel layer. As shown, the HHMT 300 includes a substrate 301, a nucleation layer 304, a buffer layer 305, a channel layer 306, a channel supply layer 307, an second spacing layer 302, and a spacing layer 303, etc. The first electrode 333 and the second electrode 330 in ohmic contact with 2DHG 308 and the third electrode 332 in Schottky contact with channel supply layer 307 are formed on one side of the channel supply layer 307. The structures similar to the HHMT shown in FIG. 1 will not be repeated here. In the embodiment shown in FIG. 3, the HHMT is formed on the left of channel layer 306. However, compared with the structure in FIG. 1, the preparation process of the structure shown in FIG. 3 may be simpler.

Figure 4:
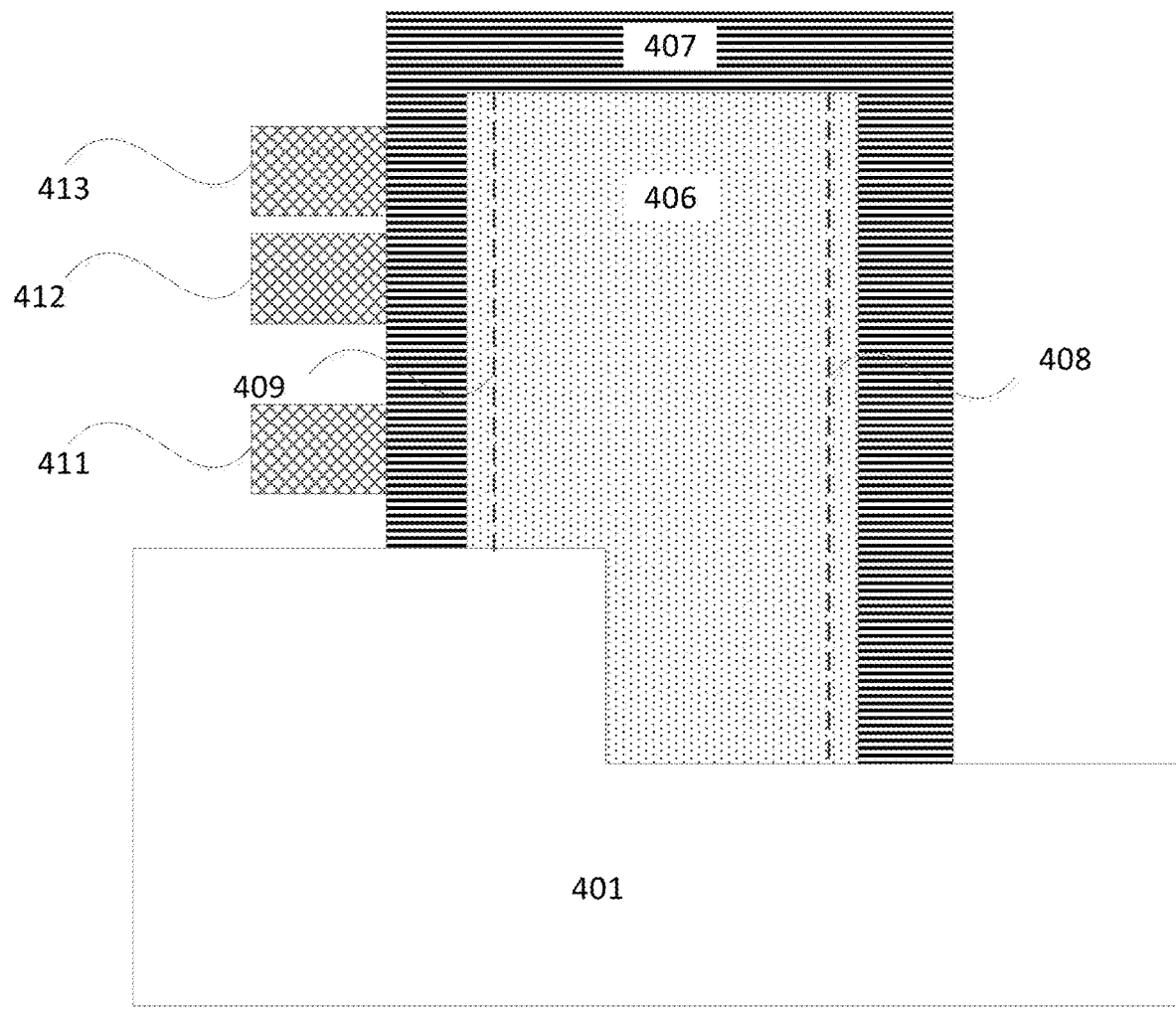
FIG. 4 is a schematic diagram of a high hole mobility transistor with non-Si substrate according to an embodiment of the present disclosure.

FIG. 4 is a schematic diagram of a HHMT according to an embodiment of the present disclosure. In the embodiment shown in FIG. 4, the substrate may be GaN intrinsic substrate. The structure and manufacturing process are relatively simple.

As shown in the figure, the HHMT 400 includes a substrate 401 and a vertical interface formed on the substrate 401, resulting in a step-shape substrate structure. The HHMT 400 comprises a channel layer 406 and a channel supply layer 407. The channel layer 406 is outside of the vertical interface of substrate 401. The channel supply layer 407 is formed outside of the channel layer 406 and covers the channel layer 406. Within the channel layer 406, 2DHG 409 and 2DEG 408 are formed near the interface of the channel supply layer 407. The first electrode 411 and the second electrode 413 in ohmic contact with the 2DHG are formed on the channel supply layer 407, and the third electrode 412 is formed on the channel supply layer 407 and is in Schottky contact with the channel supply layer 407. In some other embodiments, the substrate material may also be SiC or sapphire $Al_2O_3$.

Figure 5A:
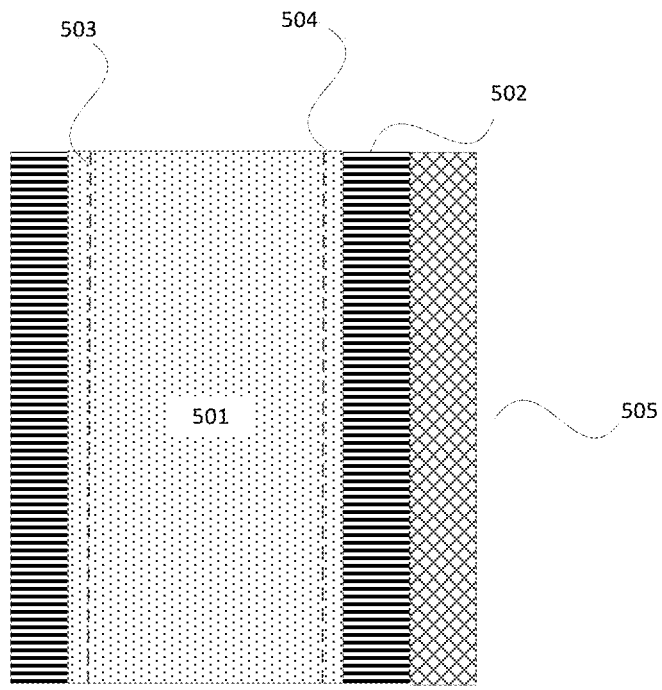
FIG. 5A is a top view of a high hole mobility transistor with non-Si substrate having vertical electrode arrangement.
Figure 5B:
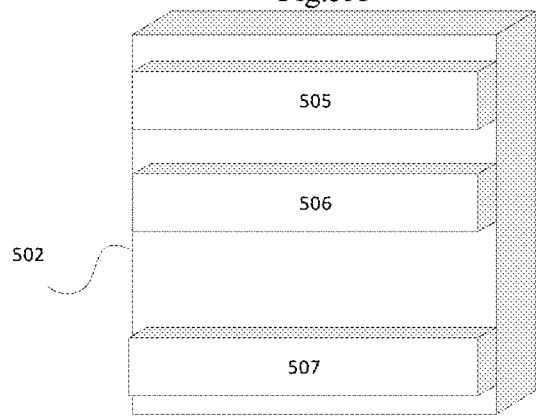
FIG. 5B is a solid diagram of a high hole mobility transistor with non-Si substrate having vertical electrode arrangement.

The different arrangements of the three HHMT electrodes are shown in embodiments of FIGS. 5A-5B and FIGS. 6A-6B. FIG. 5A is a top view of a vertical configuration of the electrodes of a HHMT according to an embodiment of the present disclosure; FIG. 5B is a solid view of a vertical configuration of the electrodes of a HHMT according to an embodiment of the present disclosure. As shown in the figures, HHMT 500 includes: a channel layer 501, a channel supply layer 502, a 2DEG 503, a 2DHG 504, a first electrode 505, a second electrode 506 and a third electrode 507. As shown in FIG. 5B, the first electrode 505, the second electrode 506 and the third electrode 507 are arranged vertically, while only the second electrode 506 can be seen in FIG. 5A. This arrangement is advantageous to reduce the wafer area occupied.

Figure 6A:
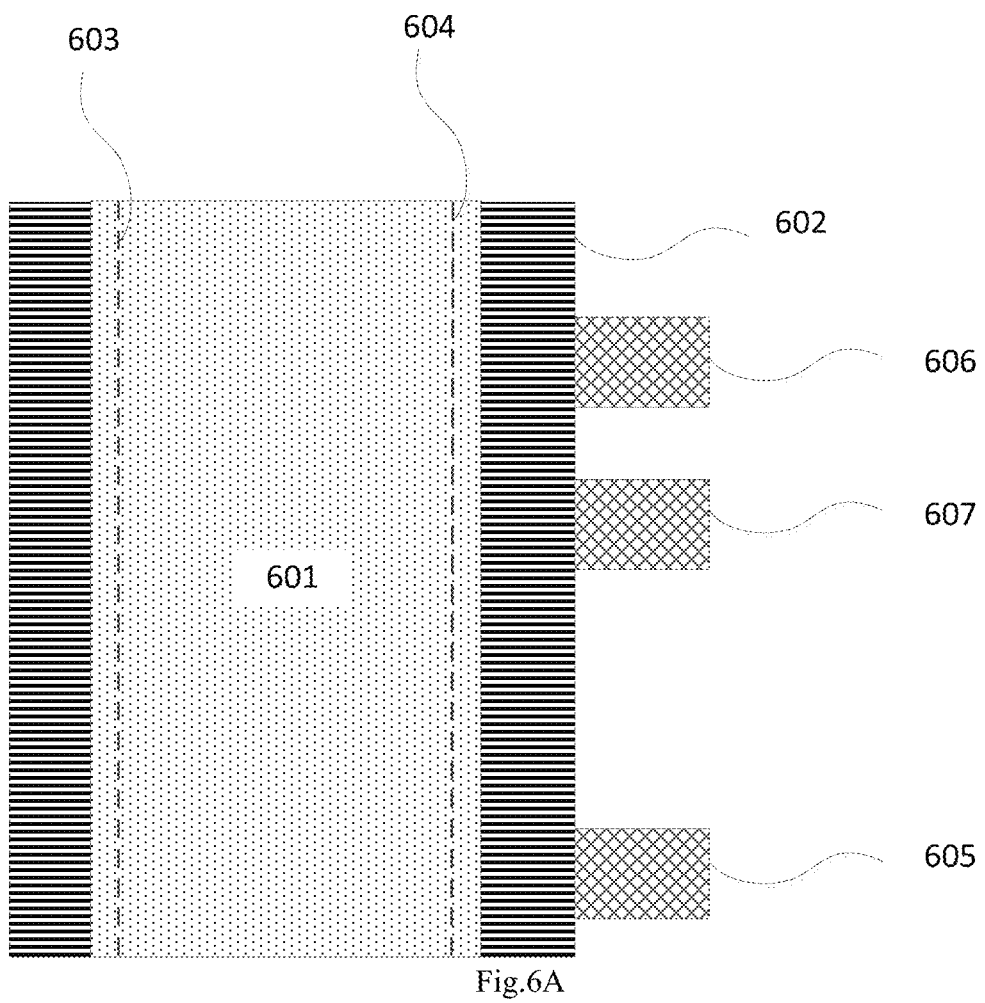
FIG. 6A is a top view of a high hole mobility transistor with non-Si substrate having horizontal or sloping electrode arrangement.
Figure 6B:
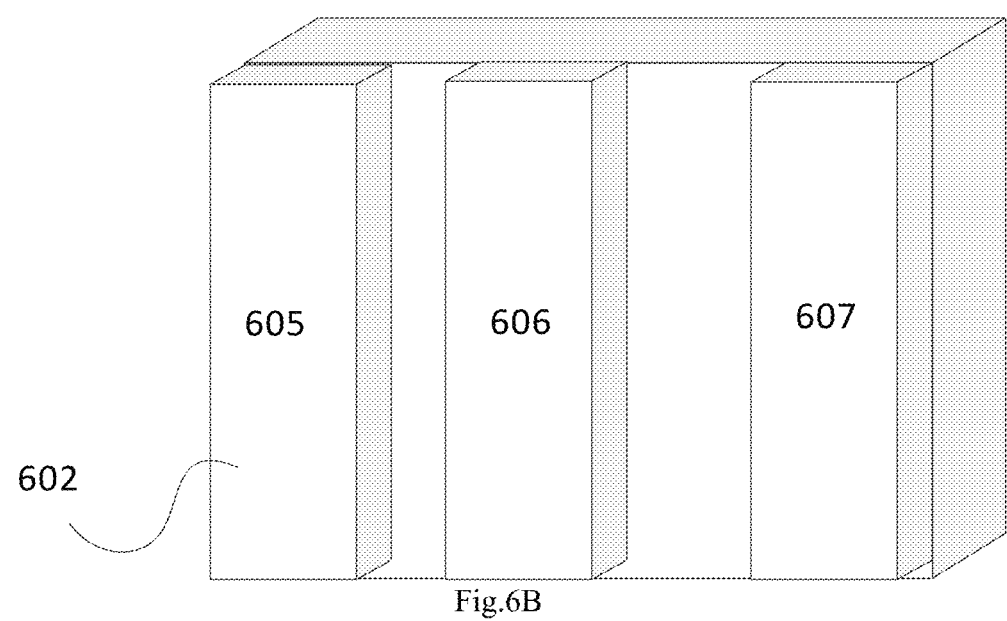
FIG. 6B is a solid diagram of horizontal electrode arrangement.

FIG. 6A is a top view of a HHMT and FIG. 6B is a solid view of the HHMT according to an embodiment of the present disclosure.

As shown in the figures, the HHMT 600 includes a channel layer 601, a channel supply layer 602, a 2DEG 603, a 2DHG 604, a first electrode 605, a second electrode 606, and a third electrode 607. In combination with the structure shown in FIG. 4, the embodiments in FIG. 6A and FIG. 6B show that the first electrode 605, the second electrode 606 and the third electrode 607 are arranged laterally and have the same horizontal height.

It should be appreciated the above description is only an illustrative embodiment of the structure of HHMT. The HHMT also have a variety of other structures or modifications, changes, or variants on these structures to provide different properties or functions. These structures and their improvement, alteration or variation may also be applied to the scheme of the disclosure under the technical conception of the disclosure.

Figure 7A:
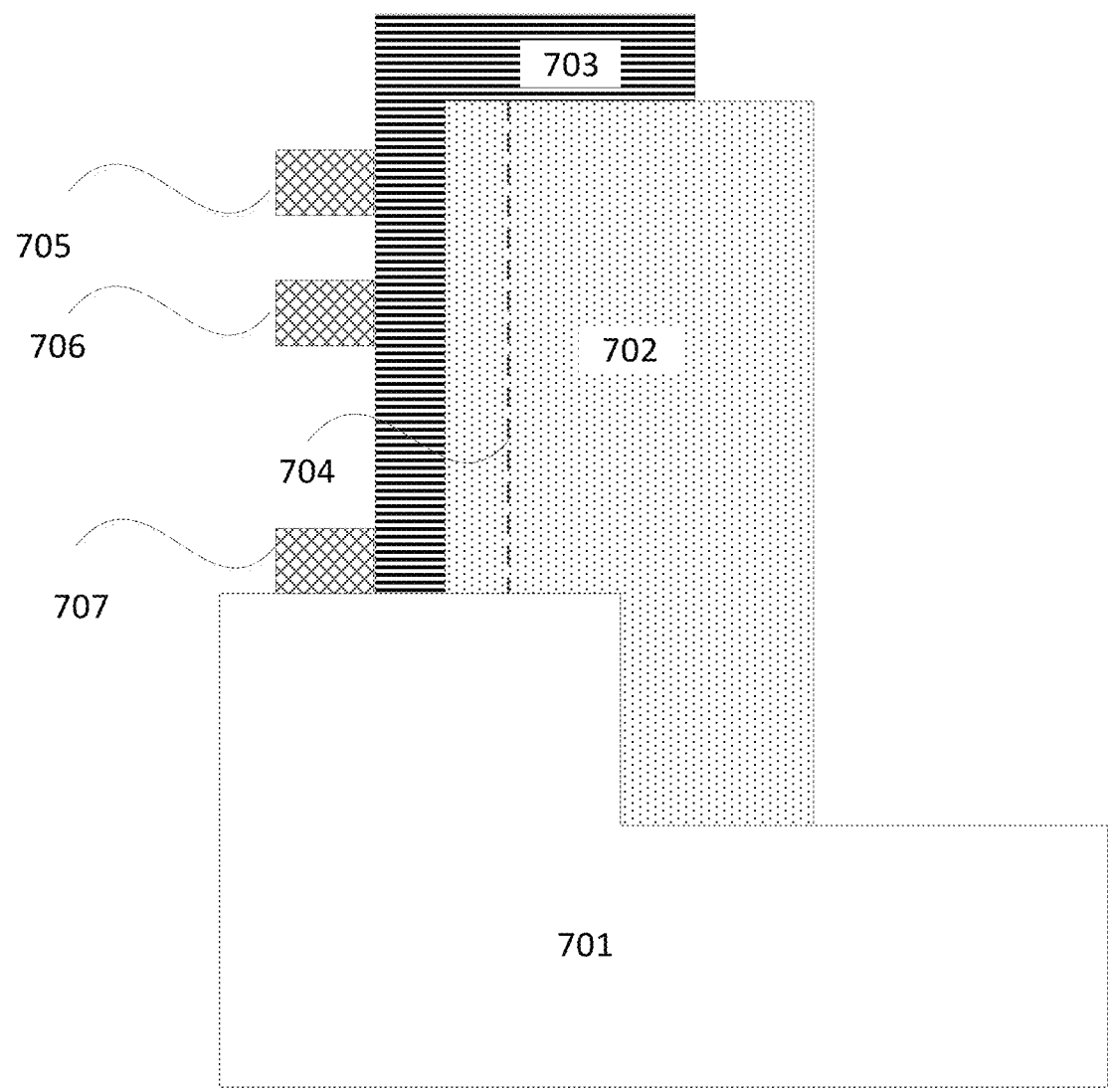
FIG. 7A is a schematic diagram of a high hole mobility transistor without two-dimensional hole gas according to an embodiment of the present disclosure.
Figure 7B:
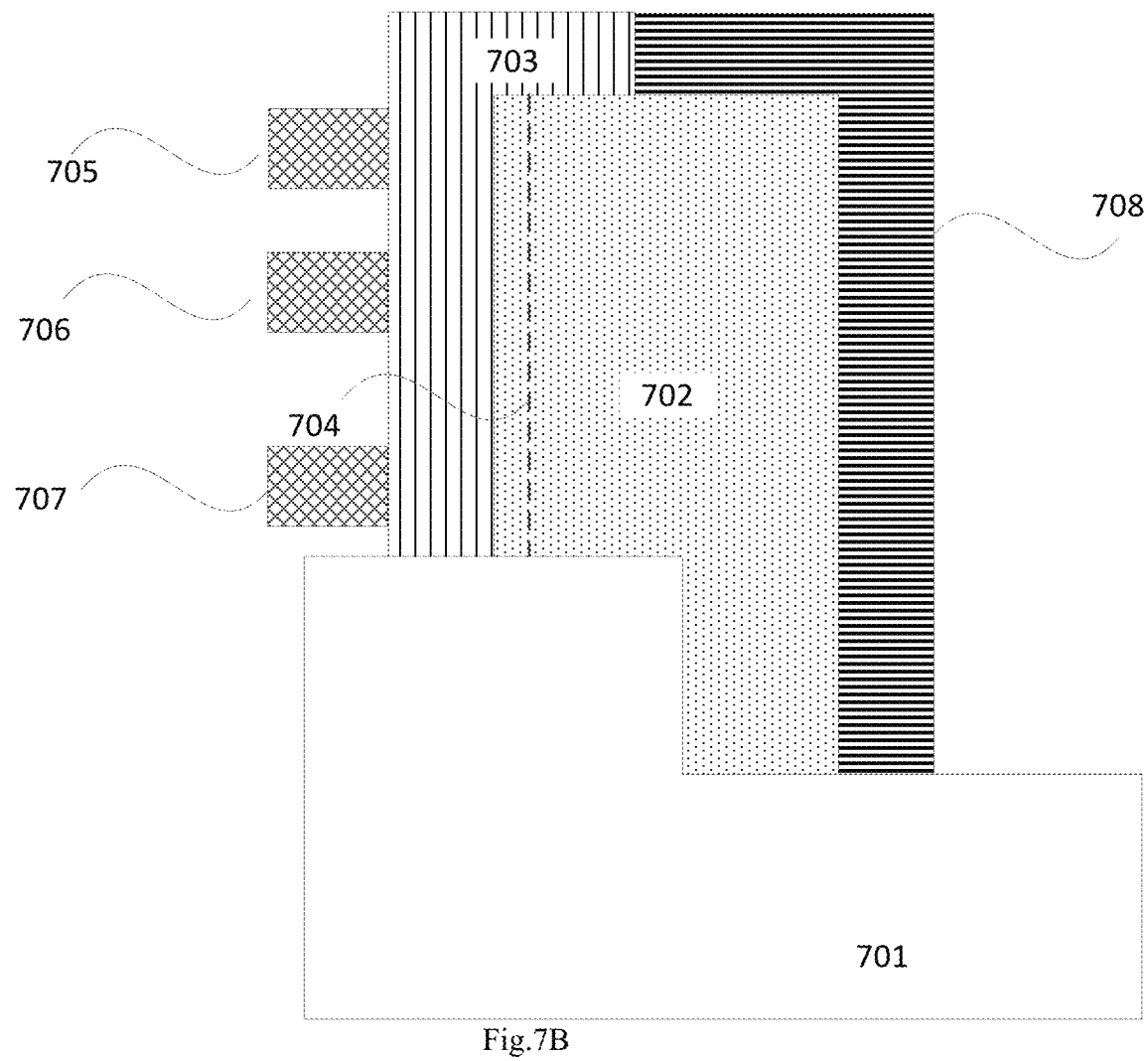
FIG. 7B is a schematic diagram of a high hole mobility transistor without two-dimensional hole gas according to an embodiment of the present disclosure.
Figure 7C:
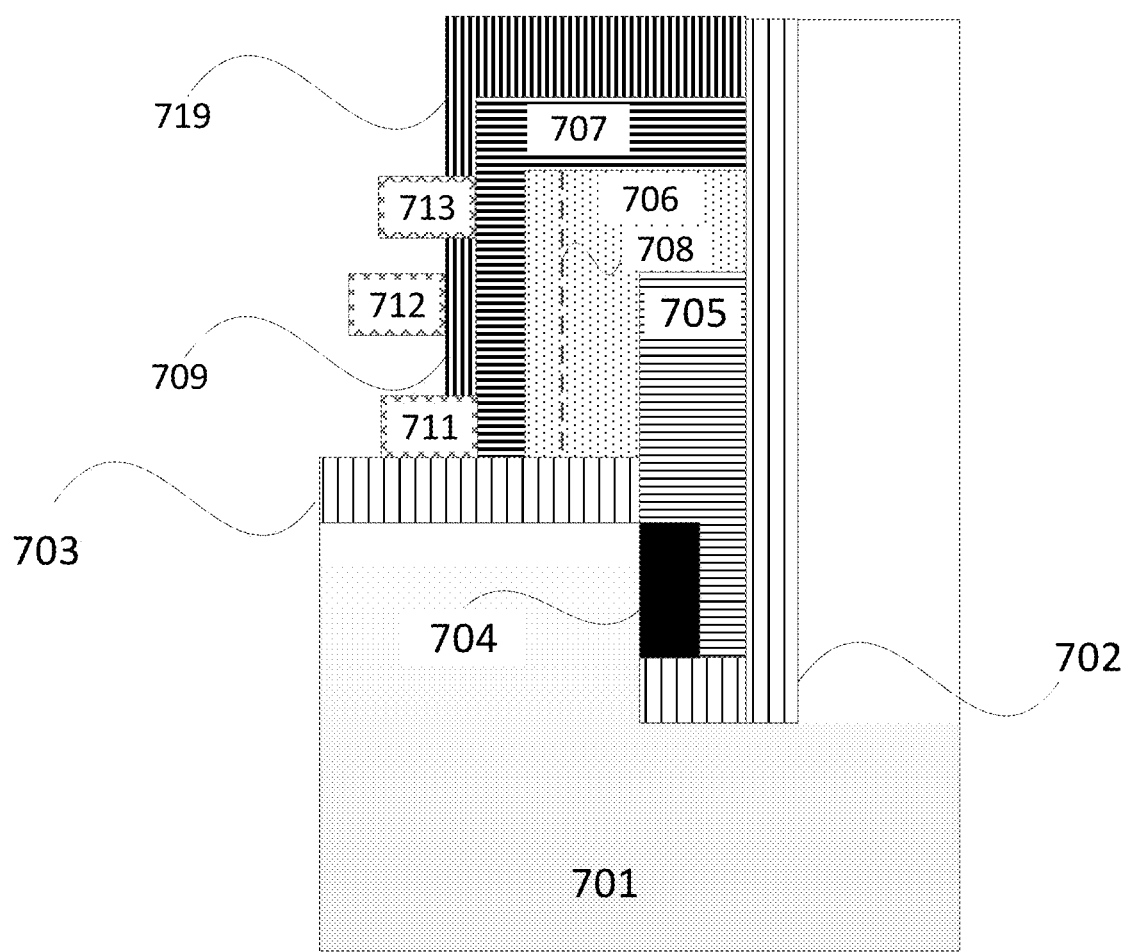
FIG. 7C is a schematic diagram of a high hole mobility transistor without two-dimensional hole gas according to an embodiment of the present disclosure.

FIGS. 7A-7C shows other structures of the one-side HHMT. FIG. 7A is a schematic diagram of a one-side HHMT according to an embodiment of the present disclosure. Like the structure of the FIG. 4 embodiment, the HHMT 700 comprises a substrate 701, a channel layer 702, and a channel supply layer 703. As shown, after the growth of channel supply layer 703 outside of the channel layer 702, the channel supply layer 703 in the left part is removed. Thus, only 2DHG 704 exists on the left side, resulting in a HHMT having 2DHG on one side. In some embodiments, the top surface of the channel layer 702 may retain a part of the channel supply layer. In some embodiments an insulating layer 707 may be introduced to cover the channel layer 702.

FIG. 7B is a schematic diagram of a one-side HHMT according to an embodiment of the present disclosure. Like the structure of the FIG. 4 embodiment, the HHMT 720 comprises a substrate 701, a channel layer 702, and a channel supply layer 703. As shown, after the channel layer 702 is grown, the insulating layer 708 is grown, and then the insulating layer 708 on the right side of channel layer 702 is etched, and the channel supply layer 703 is then grown. That is, after the channel layer is generated, an insulating layer is used to protect the channel layer, and then the channel supply layer is grown. Thus, only 2DHG 704 exists on the left side, resulting in a HHMT having 2DHG on one side.

FIG. 7C is a schematic diagram of a HHMT according to an embodiment of the present disclosure. Like the structure of the embodiment in FIG. 4, the HHMT 720 comprises a substrate 701, a spacing layer 702, a screening layer 703, the nucleation layer 703, a buffer layer 704, a channel layer 706, a channel supply layer 707, a first electrode 711, a second electrode 713, and a third electrode 712.

As shown, a right-high-left-low stepped structure is formed on the substrate before the nucleation layer 703 grows. Meanwhile, a recess structure is included in the high-low stepped structure. Then, an insulating layer is grown and a part of the insulating layer adjacent to the vertical interface within the recess is etched off to expose the vertical interface of the substrate. Then, the nucleation 703, the buffer layer 704, the channel layer 706 and channel supply layer 707 are respective grown. Thus, only 2DHG 708 on the left exists, resulting in a HHMT having 2DHG on one side. Similarly, if the left-high-right-low stepped structure including the recess structure therein is formed and then the channel layer 706 and channel supply layer 703 are grown, a one-side 2DEG HEMT can also obtained.

Figure 7D:
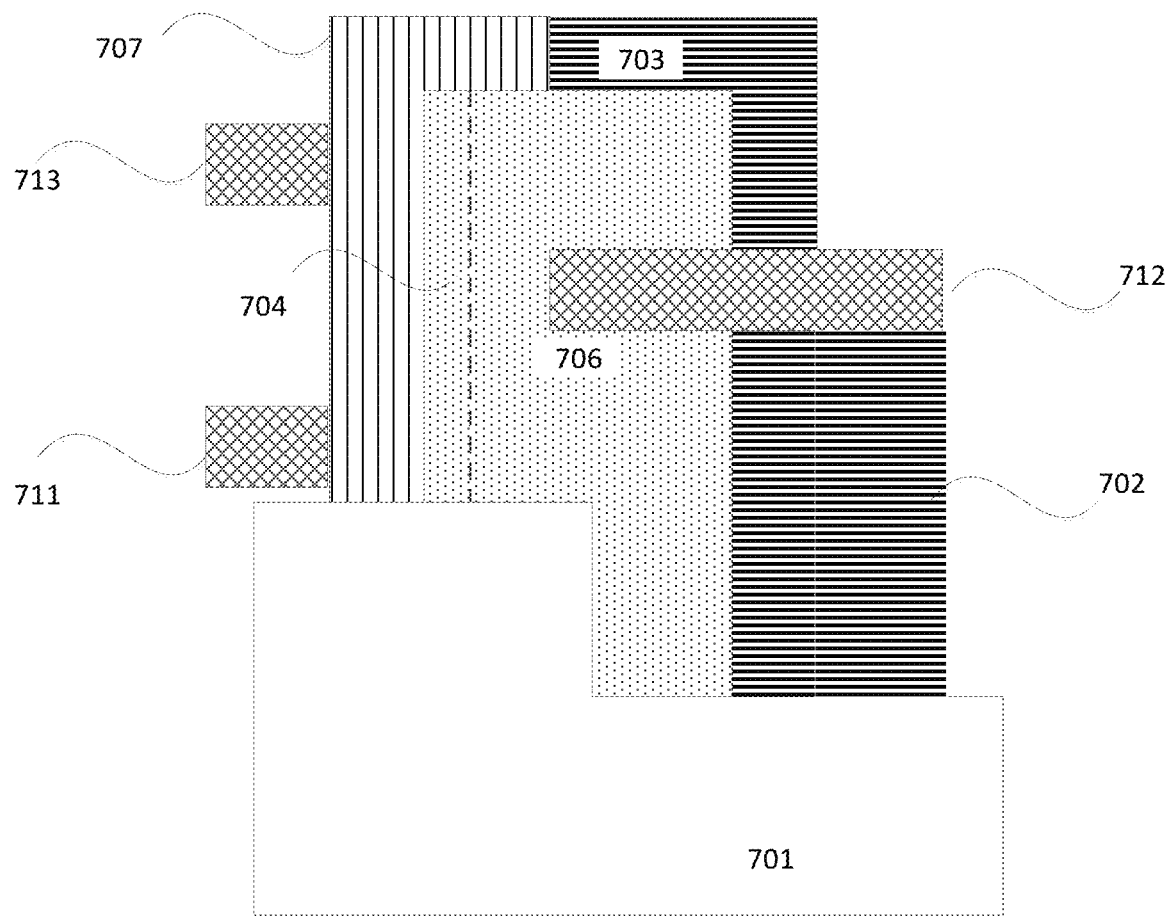
FIG. 7D is a schematic diagram of a high hole mobility transistor without two-dimensional hole gas according to an embodiment of the present disclosure.

FIG. 7D is a schematic diagram of a HHMT according to an embodiment of the present disclosure. Like the structure of the embodiment in FIG. 4, the HHMT 720 comprises a substrate 701, a spacing layer 702, a screening layer 703, a channel layer 706, a channel supply layer 707, a first electrode 711, a second electrode 713, and a third electrode 712.

As shown, after the channel layer 706 grown reaches a certain height, a third electrode 706 is formed above the channel layer, but part of the channel layer 706 is still exposed. Then, the channel layer 706 continues to grow on exposed channel layer 706, covering part of the third electrode 712. The channel supply layer 707 is grown, but only the left channel was reserved to obtain one-side 2DHG 704. The screening layer 703 is formed on the right side of channel layer 706 and channel supply layer 707, resulting in a HHMT with a third electrode 712 on the right and a first electrode and a third electrode on the left.

Figure 8:
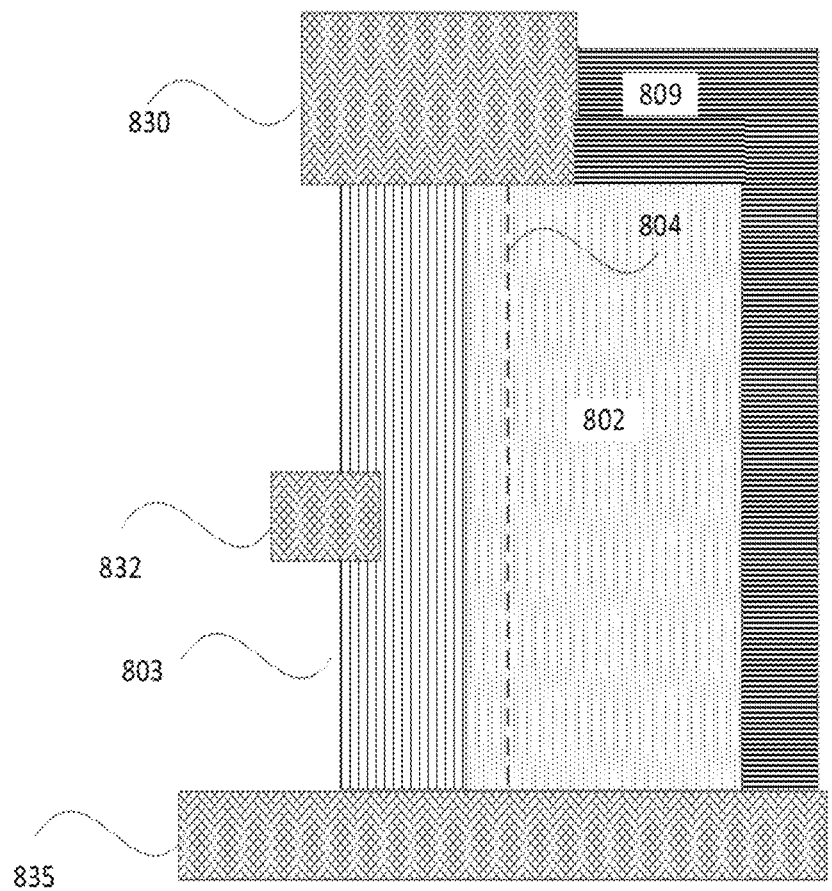
FIG. 8 is a schematic diagram of a HEMT according to an embodiment of the present disclosure.

FIG. 8 is a schematic diagram of an embodiment of the present disclosure, HHMT. As shown in the FIG., HHMT 800 includes: a channel layer 802, a channel supply layer 803, a 2DHG 804, a screening layer 809, a first electrode 835, a second electrode 830 and a third electrode 832. Unlike the structure of other embodiments, the first electrode 835 extends under the channel layer 802 and the channel supply layer 803. In some embodiments, the first electrode 835 is disposed on a substrate. After completing preparation of the structure above the first electrode 835, the substrate below may still remain. In some embodiments, the substrate under the first electrode 835 may be partially or completely removed. In this way, the first electrode 835 can be lined out from the bottom to realize electrical connection. The second electrode 830 and the third electrode 832 are still lined out from the top to realize electrical connection. In comparison with the structures in which all electrodes are electrically connected from the top, the high voltage of the first electrode requires a large insulation distance, which is adverse for reducing the size of the device; while in the structure shown in FIG. 8, the second electrode and the third electrode with low potential are lined out from the top of the device, and the first electrode is lined out from the bottom of the device, which can effectively save space, reduce parasitic capacitance inductance, and also facilitate subsequent device packaging. Furthermore, the structure shown in FIG. 8 reduces the thermal resistance of the device by removing the silicon substrate. The heat can be effectively derived from both sides, especially the first electrode which can be directly connected to the thermal conductivity device, which can greatly reduce the thermal resistance.

In preparing the HHMT shown in FIG. 8, the second and third electrodes can be formed first. After removing most or all of the silicon substrate to expose 2DHG 809, the first electrode 835 is then formed. In some embodiments, it is preferable to add a support structure to the wafer prior to the removal of the silicon substrate because the mechanical strength of the wafer is significantly reduced after substrate removal.

In some embodiments, the second electrode 830 extends laterally along top of the channel layer 806 and/or the channel supply layer 807. The second electrode is placed above the device to facilitate the electrical connection in the later stage, and also facilitates the isolation between the electrodes, improving the withstand voltage and reducing the dark current.

The above-described embodiments are merely illustrative of the present disclosure, and are not intended to limit the present disclosure. Various changes and modifications may also be made by those skilled in the art without departing from the scope of the present disclosure. Therefore, all the equivalent technical solutions should also fall within the scope of the present disclosure.

What is claimed is:

1. A high hole mobility transistor (HHMT), comprising:
   a vertical interface which is substantially perpendicular to a substrate surface;
   a channel layer disposed outside of the vertical interface;
   a channel supply layer at least partially covering a first side of the channel layer, wherein in the channel layer a vertical two-dimensional hole gas 2DHG is formed on the first side adjacent to the channel layer and the channel supply layer;
   a first electrode configured to being electronically connected to the vertical two-dimensional hole gas 2DHG;
   a second electrode configured to being electronically connected to the vertical two-dimensional hole gas 2DHG; and
   a gate electrode disposed outside of the channel supply layer.

2. The high hole mobility transistor according to claim 1, wherein the first side is a (000-1) plane of Group III nitride semiconductor.

3. The high hole mobility transistor according to claim 2, wherein the Group III nitride semiconductor is GaN.

4. The high hole mobility transistor according to claim 1, wherein the vertical interface is a Si (111) plane, sapphire $Al_2O_3$ (0001) plane, SiC (0001) plane or a (000-1), or (0001) plane of GaN intrinsic substrate.

5. The high hole mobility transistor according to claim 4, wherein the first electrode and the second electrode are positioned on one side of the two-dimensional hole gas 2DHG and the gate electrode is positioned on another side of the two-dimensional hole gas 2DHG.

6. The high hole mobility transistor according to claim 1, wherein the first electrode or the second electrode form an ohmic contact with the channel supply layer.

7. The high hole mobility transistor according to claim 1, wherein the first electrode, the second electrode, and the gate electrode are positioned on a same side of the two-dimensional hole gas 2DHG.

8. The high hole mobility transistor according to claim 1, wherein the first electrode, the second electrode, and the gate electrode are in a same level or in a same upright position.

9. The high hole mobility transistor according to claim 1, wherein the first electrode extends under the channel layer.

10. The high hole mobility transistor according to claim 1, wherein the first electrode is a drain.

11. The high hole mobility transistor according to claim 1, wherein the second electrode extends above the channel layer.

12. The high hole mobility transistor according to claim 1, wherein the second electrode is a source.

13. The high hole mobility transistor according to claim 1, further comprising a nucleation layer on the vertical interface of the substrate.

14. The high hole mobility transistor according to claim 13, further comprising a buffer layer positioned between the nucleation layer and the channel layer.

15. The high hole mobility transistor according to claim 1, further comprising a screening layer formed on the side of the channel layer away from the two-dimensional hole gas 2DHG.

16. The high hole mobility transistor according to claim 1, further comprising an insulating layer extending under the channel layer and the channel supply layer.

17. The high hole mobility transistor according to claim 1, further comprising a gate insulating layer between the channel supply layer and the gate electrode.

18. The high hole mobility transistor according to claim 1, further comprising a gate insulating layer between the channel supply layer and the gate electrode.

19. A high hole mobility transistor (HHMT), comprising:
   a column including a channel layer and a channel supply layer which vertically extend on at least one side of the column, wherein a vertical two-dimensional hole gas 2DHG is formed in the channel layer adjacent to an interface between the channel layer and the channel supply layer;
   a first electrode contacted with the column and being electrically connected with the 2DHG;
   a second electrode contacted with the column and being electrically connected with the 2DHG; and
   a third electrode deposed on the column;
   wherein the vertical 2DHG is perpendicular to a substrate surface.

20. The high hole mobility transistor according to claim 19, wherein the first electrode or the second electrode is a drain or a source; and the third electrode is a gate.

21. The high hole mobility transistor according to claim 19, wherein the first electrode, the second electrode, and the third electrode are positioned on a same side of the column.

22. The high hole mobility transistor according to claim 19, wherein the first electrode is positioned on a top of the column.

23. The high hole mobility transistor according to claim 19, wherein the second electrode is positioned under a bottom of the column.

24. The high hole mobility transistor according to claim 23, wherein an area of the second electrode is bigger than that of the bottom of the column.

25. A method of manufacturing a high hole mobility transistor, comprising:
    forming a vertical interface which is perpendicular to a substrate surface;
    forming a channel layer outside of the vertical interface; and
    forming a channel supply layer at least partially covering a first side of the channel layer, wherein the first side is a (000-1) panel of Group III nitride semiconductor, a vertical two-dimensional hole gas 2DHG is formed in the channel layer adjacent to an interface between the channel layer and the channel supply layer; and
    forming a first electrode and a second electrode being electrically connected with the two-dimensional hole gas 2DHG and a gate electrode outside of the channel supply layer.

26. The method according to claim 25, wherein the Group III nitride semiconductor is GaN.

27. The method according to claim 25, wherein the vertical interface is formed on a substrate.

28. The method according to claim 25, wherein a gate insulating layer is included between the channel supply layer and the gate electrode.

29. The method according to claim 25, further comprising transversely etching the channel supply layer or the channel supply layer and a part of the channel layer before forming a first electrode and a second ohmic contacted electrode.

30. The method according to claim 25, further comprising forming a nucleation layer on the vertical interface, wherein Chlorine gas is aerated while forming a nucleation layer.

31. The method according to claim 25, further comprising forming the second electrode and the gate electrode electrically connected to the two-dimensional hole gas 2DHG; wiping off the substrate or a part of the substrate; and forming the first electrode under the channel layer and the channel supply layer.

* * * * *